United States Patent
Millman et al.

(10) Patent No.: US 10,591,527 B2
(45) Date of Patent: *Mar. 17, 2020

(54) SCREENING METHOD FOR ELECTROLYTIC CAPACITORS

(71) Applicant: AVX Corporation, Fountain Inn, SC (US)

(72) Inventors: William A. Millman, Paignton (GB); Marc V. Beaulieu, Gray, ME (US); Michael I. Miller, Hollis Center, ME (US); Mark W. Leinonen, Scarborough, ME (US)

(73) Assignee: AVX Corporation, Fountain Inn, SC (US)

( * ) Notice: Subject to any disclaimer, the term of this patent is extended or adjusted under 35 U.S.C. 154(b) by 253 days.

This patent is subject to a terminal disclaimer.

(21) Appl. No.: 15/369,996

(22) Filed: Dec. 6, 2016

(65) Prior Publication Data

US 2017/0082671 A1 Mar. 23, 2017

Related U.S. Application Data

(63) Continuation of application No. 13/966,316, filed on Aug. 14, 2013, now Pat. No. 9,541,607.
(Continued)

(51) Int. Cl.
*G01N 37/00* (2006.01)
*G01R 31/01* (2020.01)
(Continued)

(52) U.S. Cl.
CPC ......... *G01R 31/016* (2013.01); *G01R 31/028* (2013.01); *G01R 31/2849* (2013.01);
(Continued)

(58) Field of Classification Search
CPC .......... G01R 31/016; G01R 31/028; G01R 31/2849; G01R 31/2855; G01R 31/36; H01G 9/008; H01G 9/042; H01G 9/15
(Continued)

(56) References Cited

U.S. PATENT DOCUMENTS 3,553,805 A 1/1971 Didinger, Jr.
3,930,993 A 1/1976 Best et al.
(Continued)

FOREIGN PATENT DOCUMENTS

CN 102033182 * 4/2011
CN 102033182 A 4/2011
(Continued)

OTHER PUBLICATIONS

Mark Vanbuskirk, "Reliability of electrolytic capacitors in computers", 1953, Eastern J.C.C. Proceedings, pp. 105-108. (Year: 1953).*
(Continued)

*Primary Examiner* — Michael P Nghiem
(74) *Attorney, Agent, or Firm* — Dority & Manning, P.A.

(57) ABSTRACT

A method of iteratively screening a sample of electrolytic capacitors having a predetermined rated voltage is provided. The method can include measuring a first leakage current of a first set of capacitors, calculating a first mean leakage current therefrom, and removing capacitors from the first set having a first leakage current equal to or above a first predetermined value, thereby forming a second set of capacitors. The second set can be subjected to a burn in heat treatment where a test voltage can be applied, then a second leakage current of the second set of capacitors can be measured and a second mean leakage current can be calculated. Capacitors having a second leakage current equal to or above a second predetermined value can be removed from the second set, forming a third set of capacitors. Because of
(Continued)

such iterative screening, the capacitors in the third set have low failure rates.

28 Claims, 27 Drawing Sheets

Related U.S. Application Data

(60) Provisional application No. 61/768,623, filed on Feb. 25, 2013, provisional application No. 61/695,657, filed on Aug. 31, 2012.

(51) Int. Cl.
| | |
|---|---|
| *G01R 31/28* | (2006.01) |
| *G01R 31/02* | (2006.01) |
| *G01R 31/36* | (2020.01) |
| *H01G 9/008* | (2006.01) |
| *H01G 9/042* | (2006.01) |
| *H01G 9/15* | (2006.01) |
| *H01L 49/02* | (2006.01) |
| *H01L 21/66* | (2006.01) |

(52) U.S. Cl.
CPC ......... *G01R 31/2855* (2013.01); *G01R 31/36* (2013.01); *H01G 9/008* (2013.01); *H01G 9/042* (2013.01); *H01G 9/15* (2013.01); *G01R 31/02* (2013.01); *H01L 22/00* (2013.01); *H01L 28/00* (2013.01)

(58) Field of Classification Search
USPC .......................................................... 702/84
See application file for complete search history.

(56) References Cited

U.S. PATENT DOCUMENTS

| | | | |
|---|---|---|---|
| 4,633,175 | A | 12/1986 | Ritchie et al. |
| 5,357,399 | A | 10/1994 | Salisbury |
| 5,510,719 | A | 4/1996 | Yamamoto |
| 5,882,719 | A | 3/1999 | Creasi, Jr. |
| 6,462,574 | B1 | 10/2002 | Izuru et al. |
| 6,476,617 | B1 | 11/2002 | Kawaguchi et al. |
| 6,643,121 | B1 | 11/2003 | Huntington |
| 6,673,389 | B1 | 1/2004 | Huntington |
| 6,699,767 | B1 | 3/2004 | Huntington |
| 6,751,085 | B1 | 6/2004 | Huntington |
| 6,813,140 | B1 | 11/2004 | Huntington |
| 6,849,292 | B1 | 2/2005 | Huntington |
| 7,262,511 | B2 | 8/2007 | Osako et al. |
| 7,554,793 | B2 | 6/2009 | Chacko |
| 7,671,603 | B2 | 3/2010 | Freeman |
| 7,929,058 | B2 | 4/2011 | Kim |
| 8,441,265 | B2 | 5/2013 | Paulsen et al. |
| 9,541,607 | B2* | 1/2017 | Millman .............. G01R 31/016 |
| 2006/0038304 | A1* | 2/2006 | Osako .................... H01L 24/29 257/789 |
| 2008/0182124 | A1 | 7/2008 | Gruber et al. |
| 2008/0246492 | A1* | 10/2008 | Ritter ................... G01R 31/016 324/548 |
| 2009/0224770 | A1 | 7/2009 | Freeman |
| 2009/0321107 | A1 | 12/2009 | Taylor et al. |
| 2012/0072174 | A1 | 3/2012 | Tsuru |
| 2014/0067303 | A1* | 3/2014 | Millman .............. G01R 31/016 702/84 |

FOREIGN PATENT DOCUMENTS

| | | | | |
|---|---|---|---|---|
| DE | 2404885 | * | 8/1975 | |
| DE | 2404885 | A1 | 8/1975 | |
| EP | 1 768 140 | A1 | 3/2007 | |
| EP | 1 978 370 | A1 | 10/2008 | |
| EP | 1978370 | A1 * | 10/2008 | ........... G01R 31/016 |
| FR | 2386045 | A1 | 10/1978 | |
| FR | 2386045 | * | 12/1978 | |
| FR | 3069328 | A1 * | 1/2019 | ........... G01R 31/016 |
| JP | 58102173 | * | 6/1983 | |
| JP | S 58102173 | A | 6/1983 | |
| JP | H 09325171 | A | 12/1997 | |
| JP | 2002260974 | * | 9/2002 | |
| JP | 2002260974 | A | 9/2002 | |
| JP | 2002267708 | * | 9/2002 | |
| JP | 2002267708 | A | 9/2002 | |
| JP | 2007318872 | * | 12/2007 | |
| JP | 2007318872 | A | 12/2007 | |

OTHER PUBLICATIONS

Markus Vogelsberger, "Life-Cycle Monitoring and Voltage-Managing Unit for DC-Link Electrolytic Capacitors in PWM Converters", Feb. 2011, IEEE Transactions on Power Electronics, vol. 26, No. 2, pp. 493-503. (Year: 2011).*
Shibata et al., "CS-36 M: tantalum capacitor for submarine repeating device", Technical Paper, 1974, 18 pages.
Abstract of German Patent—DE4113583, Oct. 31, 1991, 2 pages.
Search Report for FB1314468.8 dated Dec. 18, 2013, 5 pages.
MIL-PRF-55365G w/Amendment 3 (Sep. 16, 2010), downloaded from http://www.everyspec.com on Mar. 10, 2016.
AVX Corporation Surface Mount Tantalum Capacitors (created Feb. 26, 1996, modified Mar. 13, 1998, downloaded on Mar. 15, 2016 from http://hep.physics.lsa.umich.edu/tde/images/avx_tps.pdf).
Paper—Hahn, et al., "Improved SMT Performance of Tantalum Conductive Polymer Capacitors with Very Low ESR," CARTS Europe 2005, Oct. 17-20, 2005, Prague, Czech Republic.
Zednicek et al., "Low ESR and Low Profile Technology on Niobium Oxide," AVX Corporation, 2004, pp. 1-9.
Alexander Teverovsky—"Analysis of Weibull Grading Test for Solid Tantalum Capacitors," *CARTS Europe 2010*, Nov. 10-11, 2010 in Munich, Germany 18 pages.
Alexander Teverosvsky—"Screening and Qualification Testing of Chip Tantalum Capacitors for Space Applications," *CARTS USA*, 2010, New Orleans, Louisiana, 19 pages.
Performance Specification—Capacitor, Fixed, Electrolytic (Tantalum), Chip, Established Reliability, Nonestablished Reliability, and High Reliability, General Specification MIL-PRF-55365h w/Amendment 1, Oct. 18, 2012, 39 pates.
Military Handbook—Reliability Prediction of Electronic Equipment, Department of Defense, MIL-HDBK-217F, Dec. 2, 1991, Superseding MIL-HDBK-217E, Notice 1, Jan. 1, 1990—pp. Title p. 7.4.
Military Handbook—Reliability Prediction of Electronic Equipment, Department of Defense, MIL-HDBK-217-F, Dec. 2, 1991, Superseding MIL-HDBK-217F, Notice 1, Jan. 1, 1990—pp. 8.1-C4.
Mark Vanbuskirk, "Reliability of Electrolytic Capacitors in Computers", 1953 Eastern J.C.C. Proceedings, Dec. 8, 1953, pp. 105-109.
Vogelsberger et al., "Life-Cycle Monitoring and Voltage-Managing Unit for DC-Link Electrolytic Capacitors in PWM Converters", IEEE Transactions on Power Electronics, Institute of Electrical and Electronics Engineers, USA, vol. 26, No. 2, Feb. 2011, pp. 493-503.

* cited by examiner

SCREENING METHOD FOR ELECTROLYTIC CAPACITORS

CROSS REFERENCE TO RELATED APPLICATIONS

The present application is a continuation of U.S. application Ser. No. 13/966,316, now U.S. Pat. No. 9,541,607, filed on Aug. 14, 2013, which claims benefit of United States Provisional Application Ser. No. 61/695,657 having a filing date of Aug. 31, 2012 and United States Provisional Application Ser. No, 61/768,623 having a filing date of Feb. 25, 2013, which are incorporated herein by reference.

BACKGROUND OF THE INVENTION

Electrolytic capacitors are used in various medical, military, aerospace, and commercial applications where it is critical that the capacitors are reliable and have extremely low failure rates. As such, various screening methods such as accelerated aging tests, reflow tests, surge current tests, and breakdown voltage tests have been developed for screening electrolytic capacitors to eliminate defective parts. However, many of these tests have failure criteria that only look at catastrophic failures (i.e., fuse failures), which can allow defective parts to be released into the good population, and these screening methods are not capable of detecting latent defects. For instance, although a fuse may not have failed under highly stressed conditions such as high voltage and temperature, the capacitor being tested may still be damaged during screening, which can result in long-term instability. Traditional methods for screening and delivery of high reliability electrolytic capacitors have involved Weibull calculations based on a lot by lot sampling where a small number of capacitors are subjected to highly accelerated voltage (e.g., 1.5 times the rated voltage (VR)), temperature (e.g., 85° C.), and time (e.g., 40 hours or more) conditions during burn in. However, traditional Weibull burn in allows parts that are statistically different pre-burn in to move into the normal population post-burn in because there is no pre-burn in screening to remove parts with early failures. Although a majority of these parts appear to be stable through long-term reliability testing (e.g., life testing), possibly due to self-healing during burn-in, a portion of the parts passing through to the normal population are unstable and may have long term reliability issues in the field. The Weibull statistical calculation promotes the practice of leaving these unstable parts in the population so that a Weibull distribution can be created for grading purposes, as described in MIL-PRF-55365H. As a result, screening using Weibull testing cannot insure the removal of unstable or defective capacitors from the population, which can result in a capacitor lot that has an unacceptable level of reliability. Thus, despite the benefits achieved, a need exists for an improved screening method for electrolytic capacitors that can detect and remove capacitors having latent defects and well as for a method of determining the predicted failure rate of the screened capacitors that does not take the removed capacitors into account, in contrast to the Weibull method.

SUMMARY OF THE INVENTION

In accordance with one embodiment of the present invention, a method of iteratively screening electrolytic capacitors having a predetermined rated voltage is disclosed. The method comprises measuring a first leakage current of a first set of capacitors and calculating a first mean leakage current therefrom, and removing capacitors from the first set that have a measured first leakage current equal to or above a first predetermined value, thereby forming a second set of capacitors. The first predetermined value is equal to one or more standard deviations above the first mean leakage current. The method further comprises subjecting the second set of capacitors to a burn in treatment. The burn in treatment comprises applying a predetermined test voltage to the capacitors that is from about 0.8 to about 1.2 times the rated voltage. After the burn in treatment, a second leakage current of the second set of capacitors is measured and a second mean leakage current is calculated therefrom. Next, the capacitors from the second set that have a measured second leakage current equal to or above a second predetermined value are removed from the second set, thereby forming a third set of capacitors. The second predetermined value is equal to one or more standard deviations above the second mean leakage current.

In another embodiment, a method of supplying a lot of capacitors to a customer is disclosed. The method comprises determining a rated voltage for the capacitors, and iteratively screening the capacitors to remove capacitors from the lot having a leakage current above a predetermined value at each iteration. The predetermined value is equal to one or more standard deviations above the mean leakage current measured at each iteration. After the screening, the lot of capacitors can be supplied to the customer without derating the rated voltage.

In still another embodiment, a method for calculating a predicted failure rate for electrolytic capacitors is disclosed. The method comprises subjecting the capacitors to a burn in treatment at a first temperature and a first voltage for a first time period; subjecting the capacitors to a life test at a second temperature and a second voltage for a second time period; and determining the number of capacitors failing after the life test based on the number of capacitors having a leakage current above a predetermined level, wherein the calculation to determine the predicted failure rate excludes capacitors failing prior to the burn in treatment.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Figure 1:
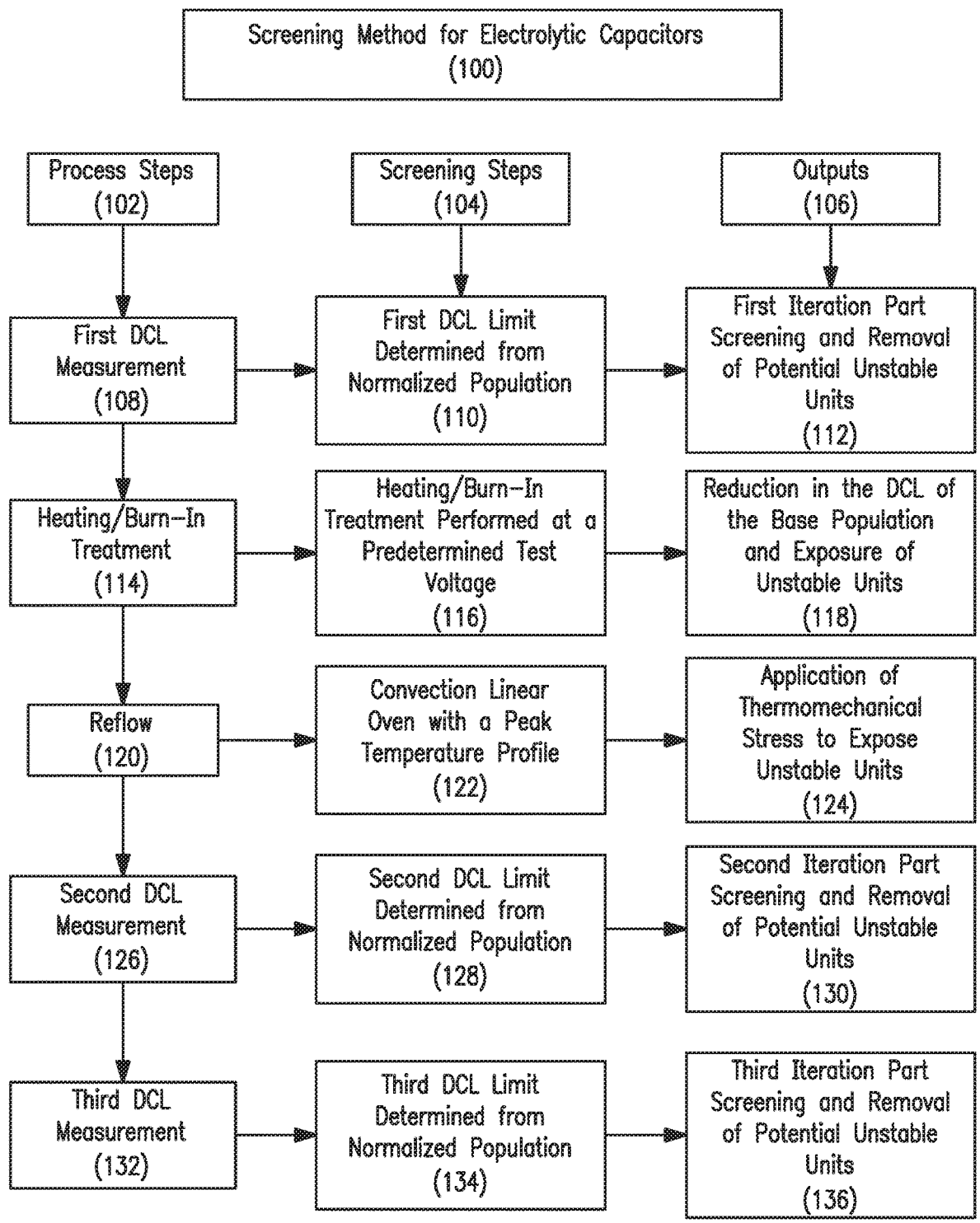
FIG. 1 is a block diagram that depicts one embodiment of the method of the present invention.

Repeat use of reference characters in the present specification and drawings is intended to represent the same or analogous features or elements of the present invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention.

Generally speaking, the present invention is directed to a method of iteratively screening electrolytic capacitors. The method of screening a lot or sample of electrolytic capacitors (i.e., 2 or more capacitors) described in the present application includes measuring the leakage current of the capacitors at multiple iterations in the testing process and then removing capacitors from the sample or lot that have a leakage current above a predetermined value as determined through statistical analysis at each iteration. For example, the leakage current of a first set of capacitors, which can include all of the capacitors in the lot, can be measured, and the capacitors in the first set having a leakage current above a predetermined value after the first leakage current measurement can be removed from the sample or lot, and the remaining capacitors form a second set of capacitors that can be subjected to further testing. The further testing can include a burn in heat treatment of the capacitors at a predetermined voltage, such as the rated voltage of the capacitors, which is a predetermined rating that refers to the DC rated voltage for continuous operation up to 85° C. The rated voltage is based on the thickness of the dielectric layer. The burn in treatment can be used to place stress on the capacitors to detect any unstable parts upon measuring the leakage current of the second set of capacitors.

After the burn in process is completed, additional processing such as reflow can occur, which can place further stress on the capacitors. Either before reflow or after reflow, a second iteration of screening can take place, where the leakage current for each of the capacitors in the second set is measured, and capacitors in the second set having a leakage current above a new, second predetermined value are removed from the second set, forming a third set of capacitors that can then be subjected to further testing. Further, a third iteration of screening can take place at the end of the screening process, where the leakage current for each of the capacitors in the third set is measured, and capacitors in the third set having a leakage current above a third predetermined value are removed from third set, forming a fourth set of capacitors. The first, second, and third predetermined values are determined through statistical analysis. In addition to screening the capacitors based on leakage current, other parameters such as capacitance, equivalent series resistance (ESR), and dissipation factor (DF) can be measured and the capacitors can be further screened based on statistical analysis of the mean capacitance, ESR, and DF results. Without intending to be limited by theory, it is thought that subjecting the capacitors to be screened to a burn in treatment at a predetermined test voltage that is close to their rated voltage, as opposed to a test voltage that is 1.5 times their rated voltage, which can permanently damage the capacitors, in combination with subjecting the capacitors to multiple iterations of leakage current testing to screen out any capacitors above a predetermined value at each iteration can effectively screen out unstable capacitors to produce a lot of capacitors having extremely high reliability and extremely low failure rates. Such high reliability and low failure capacitors are critical in certain applications, including medical, military, and aerospace applications.

One embodiment of the method of the present invention is shown in the block diagram of FIG. 1, although it is to be understood that the steps can be performed in a different order, and additional testing or iterative screening can be completed to further remove defective or unstable capacitors. The iterative screening method 100 of FIG. 1, for example, shows various process steps 102 and screening steps 104 that are implemented to arrive at specific outputs 106. The process steps 102 include: first iteration (pre-burn in) leakage current (DCL) measurement 108, burn in 114, reflow 120, second iteration (post-burn in) leakage current (DCL) measurement 126, and third iteration leakage current (DCL) measurement 132.

The leakage currents at steps 108, 126, and 132 are measured using a leakage test set that measures leakage current (DCL) at a predetermined temperature and at the rated voltage after a minimum of 10 seconds. For example, the leakage current can be measured after 3 minutes at a temperature ranging from about 20° C. to about 85° C., through a charge resistor having a minimum resistance of 1 kΩ that is connected in series with the capacitor, with rated voltage applied. The leakage current can also be measured at higher temperatures (i.e., hot DCL), although the applied voltage may be about ⅔ of the rated voltage at temperatures greater than about 85° C., up to about 140° C., such as at about 125° C., to normalize the stress on the capacitor to that experienced at, for example, about 85° C. The leakage current, or DCL, refers to the amount of current flowing through a capacitor when a direct voltage is applied after the charging of the capacitor. Generally, the leakage current can be used to determine whether a capacitor has defects or might fail, and a capacitor can be required to have a leakage current below a minimum level if it is to be qualified for use in a given application. The leakage current depends on a multitude of factors, such as the voltage applied to the capacitor, temperature conditions, and the type of electrolyte used in the capacitor. As will be discussed below, results from leakage current measurements taken at various iterations of the screening process can be used to determine if a capacitor is acceptable or if it should be removed from a given lot or sample.

Turning now to the specific process steps, screening steps, and outputs, the iterative screening method of the present invention is discussed. In a first iteration of the screening method, a first leakage current can be measured for the lot or sample of capacitors to be tested (i.e., a first set of capacitors), as shown in process step 108 of FIG. 1. The first leakage current can be determined at a temperature that ranges from about 20° C. to about 150° C. in some embodiments. For example, the DCL may be measured at a temperature ranging from about 20° C. to about 30° C. in some embodiments, such as about 25° C., from about 75° C. to about 95° C. in some embodiments, such as about 85° C., and from about from about 100° C. to about 150° C. in still other embodiments. For instance, the temperature can range from about 110° C. to about 140° C., such as from about 120° C. to about 130° C., such as about 125° C. However, when the leakage current is measured at a temperature greater than about 85° C., as discussed above, the voltage applied during the leakage current measurement may be about ⅔ of the rated voltage, as discussed above. Regardless of the temperature at which the first leakage current is determined, a first mean leakage current can be calculated from the data collected related to the first leakage current measurements for the first set of capacitors. After the first mean leakage current is determined, a first predetermined value can be calculated for the first set of capacitors, which can be equal to one or more standard deviations above the first mean leakage current. In some embodiments, however, the first predetermined value can be equal to three or more standard deviations above the first mean leakage current. This is demonstrated by process step 110 where the first limit (i.e., predetermined value) is determined. Then, any capacitors having a first leakage current above the first predetermined value can be removed from the sample or lot as they represent potential unstable capacitors or outliers, as shown in output step 112. Meanwhile, any capacitors having a first leakage current below the first predetermined value pass the first iteration of screening and can remain in the lot or sample for further screening beyond the first iteration screening, thus forming the second set of capacitors.

After removal of capacitors above the first predetermined value, the second set of capacitors (i.e., the capacitors in the lot or sample that have passed the first iteration screening 112) are subjected to a burn in treatment as shown in process step 114. Generally, burn in is the process by which capacitors can be subjected to harsh conditions to determine if they will have a tendency to fail early on in their lifespan. The burn in treatment 114 can involve selectively controlling and applying a predetermined test voltage to the capacitors, as shown in step 116. The burn in treatment can be conducted at a temperature that can range from about 100° C. to about 150° C. in some embodiments, from about 110° C. to about 140° C. in other embodiments, and from about 115° C. to about 130° C. in still other embodiments. For example, the second temperature can be 125° C. Regardless of the temperature at which the heating or burn in treatment 114 is conducted, the burn in treatment can occur for an amount of time ranging from about 25 hours to 75 hours in one embodiment. Meanwhile, the burn in process time can range from about 35 hours to about 50 hours in other embodiments, such as from about 40 hours to about 45 hours. For example, the burn in process time can be 42 hours.

Further, regardless of the temperature or time frame of the burn in process, the burn in process includes selectively controlling and applying a predetermined voltage to the second set of capacitors. The voltage applied is generally a ratio of the rated voltage of the capacitors to be tested. For instance, the voltage to be applied can range from about 0.7 to about 1.3 times the rated voltage in some embodiments, from about 0.8 to about 1.2 times the rated voltage in other embodiments, and from about 0.9 to about 1.1 times the rated voltage in still other embodiments. For example, the voltage applied during the burn in process can be about 1.0 times the rated voltage of the capacitors remaining in the sample or lot to be tested. It has been discovered that subjecting the capacitors in the second set to a burn in treatment carried out at about 1.0 times the rated voltage of the capacitors allows for sufficient screening of unstable or defective capacitors in subsequent screening iterations without causing damage to the capacitors, which has been seen at higher voltages, such as those used during Weibull testing. Generally, the burn in treatment step 116 results in a reduction in the leakage current of the base population of capacitors and can be used to further expose unstable units, as shown in output 118. It should be noted that the reduction in leakage current at this stage can be due to self-healing, so a second iteration leakage current screening step 130 can be conducted for the second set of capacitors that passed the first iteration leakage current screening step 112 to remove any outliers or defective parts after the burn in process has been completed. The second iteration leakage current screening step 130 can be performed after burn in, or after the reflow process step 120, as is discussed in more detail below.

If desired, soldering via the reflow process step 120 can be performed on the second set of capacitors before measuring a second iteration leakage current 126 for the second set of capacitors. The reflow process step 120 can subject the capacitors to further stresses in order to uncover additional unstable capacitors upon second iteration leakage current screening 130. However, as noted above, this specific process order is not required, and it should be understood that in some instances, the second iteration leakage current screening 130 can be completed after the burn in treatment 114 yet before reflow 120. In some instances, it may even be possible to perform the reflow step on the first set of capacitors.

If the reflow process step 120 is completed before subjecting the second set of capacitors to the second iteration leakage current screening step 130, as is shown in FIG. 1, it can be completed after the burn in treatment. Generally, reflow is the process by which capacitors can be soldered to a board. Reflow soldering after burn-in can expose capacitors that have become unstable as a result of the additional thermomechanical stress that the reflow process exerts on the capacitors, as shown in output 124 of FIG. 1, when the second set of capacitors are subjected to a second iteration leakage current screening 130. For this reason, reflow can be performed before the second iteration leakage current measurement 126 to further screen and remove any unstable parts. The basic reflow solder process includes the steps of applying a solder paste to the desired pads on a printed circuit board (PCB) such as an FR-4 board, placing the capacitors in the paste, and applying heat to the assembly, which causes the solder in the paste to melt (reflow). The solder then wets onto the PCB and the capacitor terminations, resulting in the desired solder fillet connection. The reflow process can take place in a convection linear oven as shown in step 122 of FIG. 1. The convection linear oven can have a peak temperature profile of from about 200° C. to about 280° C. in some embodiments, such as from about 205° C. to about 270° C. in other embodiments, and from about 210° C. to about 260° C. in still other embodiments. For example, in medical, military, and aerospace applications where SnPB (lead-based) solders are used that can melt at a lower temperature, reflow can occur at a temperature ranging from about 210° C. to about 225° C. Meanwhile, for commercial applications using lead-free solder that melts at a higher temperature, reflow can occur at a temperature ranging from about 245° C. to about 260° C. Note that although the reflow process discussed above uses a convection oven, the reflow process can also use an infrared convection oven or a vapor phase oven, and can be conducted via wave soldering or by using a hot plate.

After the reflow process is completed, a second iteration leakage current can be measured for the second set of capacitors, as shown in FIG. 1 as process step 126, although in some embodiments, the second leakage current can also be measured before reflow. The second leakage current can be measured for capacitors passing the first iteration leakage current screening 112 (i.e., the second set of capacitors) that have also been subjected to the burn in treatment 114 and reflow 120, as shown in FIG. 1. The second leakage current can be determined at a temperature that ranges from about 20° C. to about 150° C. in some embodiments. For example, the DCL may be measured at a temperature ranging from about 20° C. to about 30° C. in some embodiments, such as about 25° C., from about 75° C. to about 95° C. in some embodiments, such as about 85° C., and from about from about 100° C. to about 150° C. in still other embodiments. For instance, the temperature can range from about 120° C. to about 130° C., such as about 125° C. However, when the leakage current is measured at a temperature greater than about 85° C., as discussed above, the voltage applied during the leakage current measurement may be about ⅔ of the rated voltage, as discussed above. Regardless of the temperature at which the second leakage current is determined, a second mean leakage current can be calculated from the data collected related to the second leakage current measurements for the second set of capacitors. After the second mean leakage current is determined, a second predetermined value can be calculated for the second set of capacitors, which can be equal to one or more standard deviations above the second mean leakage current. In some embodiments, however, the second predetermined value can be equal to three or more standard deviations above the second mean leakage current. This is demonstrated by process step 128 where the second limit (i.e., predetermined value) is determined. Then, any capacitors having a second leakage current above the second predetermined value can be removed from the sample or lot as they represent potential unstable capacitors or outliers, as shown in output step 130. Meanwhile, any capacitors having a second leakage current below the second predetermined value pass the second iteration of screening and can remain in the lot or sample for further screening beyond the second iteration screening, thus forming the third set of capacitors. Note that if the reflow process 120 was not performed prior to measuring the second leakage current for the second set of capacitors, after the second iteration of leakage current screening, the resulting third set of capacitors can be subjected to the reflow process 120 as discussed above.

As an additional process step, functionality testing 132 can be undertaken to determine standard capacitor characteristics for the capacitors passing both the first iteration leakage current screening 112 and the second iteration leakage current screening 130 discussed above (i.e, the third set of capacitors). At this stage, additional unstable or defective capacitors can be screened and removed from the lot or sample based on further statistical analysis. The functionality testing can be carried out at temperature ranging from about 15° C. to about 35° C. in some embodiments, or from about 20° C. to about 30° C. in other embodiments. For example, the testing can be carried out at 25° C.

Regardless of the temperature at which the functionality testing 132 is conducted, a third iteration leakage current can be measured for the capacitors remaining in the sample (i.e., the third set of capacitors), as shown in FIG. 1.

Regardless of the temperature at which the third leakage current is determined, a third mean leakage current can be calculated from the data collected related to the third leakage current measurements for the third set of capacitors. After the third mean leakage current is determined, a third predetermined value can be calculated for the third set of capacitors, which can be equal to one or more standard deviations above the third mean leakage current. In some embodiments, however, the third predetermined value can be equal to three or more standard deviations above the third mean leakage current. This is demonstrated by process step 134 where the third limit (i.e., predetermined value) is determined. Then, any capacitors having a third leakage current above the third predetermined value can be removed from the sample or lot as they represent potential unstable capacitors or outliers, as shown in output step 136. Meanwhile, any capacitors having a third leakage current below the third predetermined value pass the third iteration of screening and can remain in the lot or sample for release or for further screening beyond the third iteration screening, thus forming the fourth set of capacitors. Thus, these capacitors will have undergone at least three iterations of leakage current screening based on statistical analysis to ensure that the capacitors remaining in the lot are highly reliable with an extremely low risk of failure.

Additional tests (not shown in FIG. 1) can be conducted on the capacitors screened in the third iteration 132. In addition to screening based on the leakage current, the capacitors passing the first two iterations of leakage current screening (i.e., the third set of capacitors) can be tested for their equivalent series resistance (ESR), dissipation factor (DF), and capacitance measurements. These capacitors can then be further screened to remove any unstable parts based on statistical analysis collected in regards to ESR, DF, and capacitance. For example, if the capacitance is measured, the capacitors can be screened based on meeting a guard banded tolerance limit, while if the ESR and/or DF are measured, any outliers present beyond 1 or greater standard deviations above the mean cutoff limited will be discarded from the lot or sample to be released for use.

The screening method as described in the present invention can be performed both solid and wet electrolytic capacitors. The solid or wet electrolytic capacitor screened by the method of the present invention may be used in various applications, including but not limited to medical devices, such as implantable defibrillators, pacemakers, cardioverters, neural stimulators, drug administering devices, etc.; automotive applications; military applications, such as RADAR systems; consumer electronics, such as radios, televisions, etc.; and so forth. In one embodiment, for example, the capacitor may be employed in an implantable medical device configured to provide a therapeutic high voltage (e.g., between approximately 500 Volts and approximately 850 Volts, or, desirably, between approximately 600 Volts and approximately 800 Volts) treatment for a patient. The device may contain a container or housing that is hermetically sealed and biologically inert. One or more leads are electrically coupled between the device and the patient's heart via a vein. Cardiac electrodes are provided to sense cardiac activity and/or provide a voltage to the heart. At least a portion of the leads (e.g., an end portion of the leads) may be provided adjacent or in contact with one or more of a ventricle and an atrium of the heart. The device also contains a capacitor bank that typically contains two or more capacitors connected in series and coupled to a battery that is internal or external to the device and supplies energy to the capacitor bank. Due in part to high conductivity, the capacitor screened by the method of the present invention can achieve excellent electrical properties and thus be suitable for use in the capacitor bank of the implantable medical device. For example, the equivalent series resistance ("ESR")—the extent that the capacitor acts like a resistor when charging and discharging in an electronic circuit—may be less than about 1500 milliohms, in some embodiments less than about 1000 milliohms, and in some embodiments, less than about 500 milliohms, measured with a 2-volt bias and 1-volt signal at a frequency of 1000 Hz.

After a sample or lot of capacitors has been screened by the method of the present invention, the sample of lot of capacitors can be supplied to a customer without the need to first derate the voltage at which the capacitors can be used to a level that is lower than the predetermined rated voltage. In other words, the screening method can filter out unstable capacitors so that the capacitors supplied to the customer can be used at their rated voltage as opposed to a lower (i.e., derated) voltage.

Figure 26:
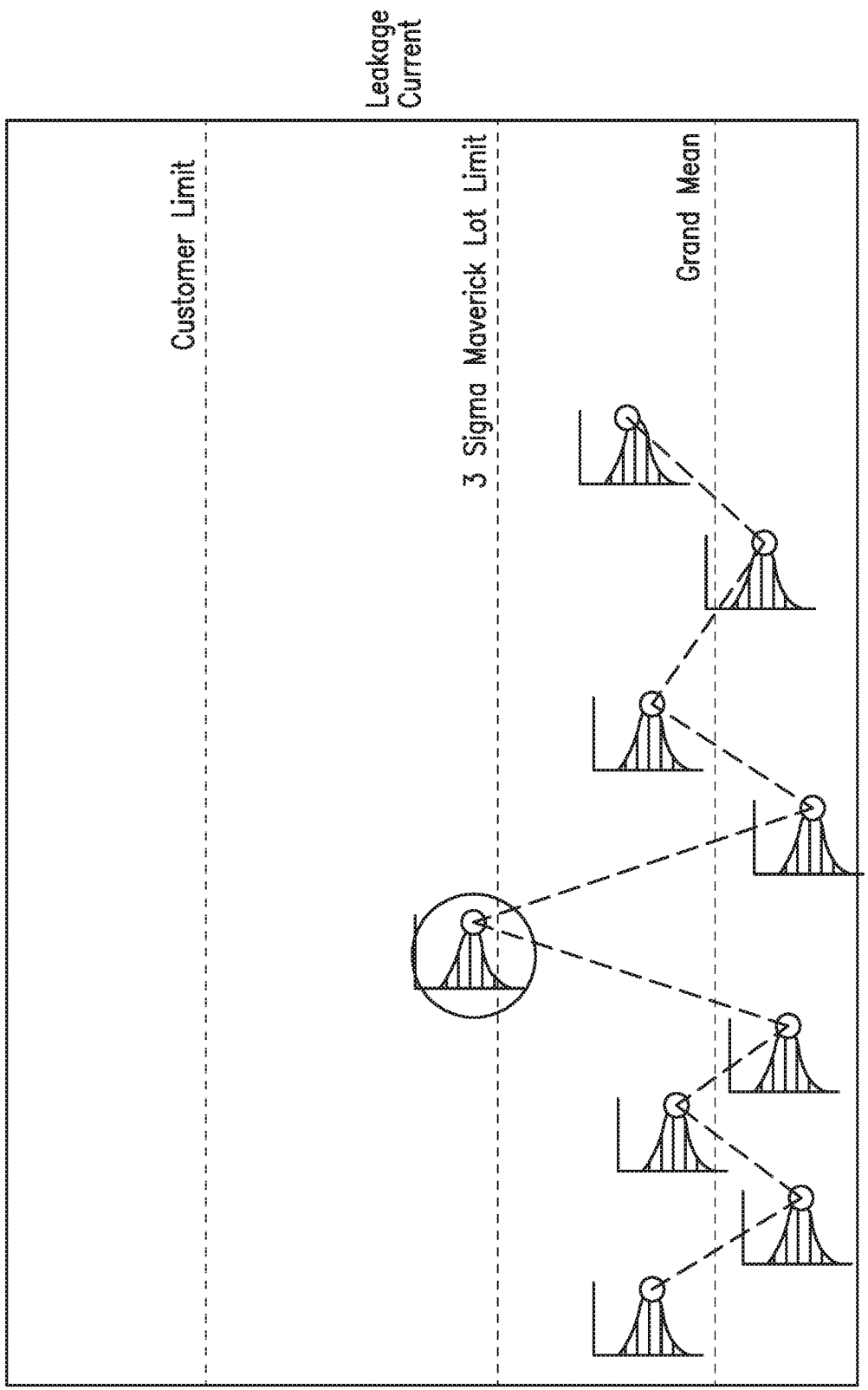
FIG. 26 is a graph showing one method for determining if a lot of capacitors is an outlier/maverick when compared to other lots of capacitors.

To further minimize the risk of the presence of latent defects in a lot of capacitors that have been screened according to the iterative screening method discussed above, an additional screening step based on a comparison of the screened lot to other screened lots of capacitors can be performed as a safeguard to filter out a screened lot having a mean leakage current that is an outlier/maverick compared to the mean leakage current of all of the screened lots considered as a whole. The mean leakage current of all of the screened lots considered as a whole is referred to as the grand mean leakage current. As shown in FIG. 26, the grand mean leakage current of multiple lots of capacitors after they have been screened can be determined. The mean leakage current for each of the screened lots can be determined using capacitors in the lot that have passed the first leakage current screening, such as on capacitors that have undergone a burn in heat treatment or any additional treatments and/or screening. Then, any capacitor lots having a mean leakage current above a predetermined value, such as a leakage current value that is one or more standard deviations above the grand mean leakage current for all of the lots, can be rejected as a lot to be supplied to the customer. For instance, a lot having a mean leakage current that is more than three standard deviations above the grand mean leakage current can be rejected. This additional screening step can limit the lot to lot variation of capacitors that are supplied to the customer.

Meanwhile, because the screening method of the present application involves removing from a lot of capacitors any capacitors having an initial leakage current above a predetermined level prior to the burn in process, where such capacitors can be referred to as early time failures or infant mortals, it is not possible to calculate a predicted failure rate with the traditional Weibull model as described in MIL-PRF-55365H. Further, it is noted that the Weibull method fails to take into account the effects of multi-side reflowing of surface mount parts onto substrates into its predicted failure rate calculation. As such, when utilizing the screening method of the present application, it is to be understood that the predicted failure rate can be calculated via a new method as explained below.

As an initial matter, it is to be understood that to determine the predicted failure rate of a lot of capacitors supplied to a customer, before any calculation is performed, a simulated production routine is completed on a sample from the population, where the production routine includes double-sided reflow. Then, a calculation is performed based on the behavior of the sample through a simulated production routine. Generally, the predicted failure rate calculation is based on two main steps where the results of life testing a number of parts at an accelerated temperature (e.g., 125° C.) and a voltage (e.g., $\frac{2}{3}$ of the rated voltage), for a specific amount of time, are translated into an equivalent number of component/device hours at 25° C. Then, the number of failures and the equivalent component/device hours are used to calculate a predicted failure rate and the mean time between failures. The determination of the equivalent device/component hours is based upon the MIL-HDBK-217 reliability prediction using the Arrhenius model as applied to solid tantalum capacitors, where the Arrhenius model is used to predict failure acceleration due to temperature increases, and wherein the MIL-HDBK-217 handbook is incorporated herein in its entirety by reference thereto for all purposes. The equivalent device/component hours calculation also takes into account the activation energy of tantalum capacitors, which can range from about 1.08 eV to about 1.15 eV.

Meanwhile, the failure rate calculation is based on a chi-squared calculation for time-bounded sample testing, where the degrees of freedom equals the sum of the number of failures and 1, multiplied by 2. The parameters to be input into the failure rate calculation include the rated voltage of the capacitors, the number of capacitors tested, the number of hours the capacitor parts were tested, the test temperature, the test voltage, the number of failures, the desired confidence level, the desired application temperature, and the desired application voltage. The resulting outputs calculated include the equivalent number component/device hours at 25° C. as demonstrated by the life testing of a specific number of samples at a specific voltage and temperature for a specific amount of test time, which takes into account a test temperature acceleration factor, a test voltage acceleration factor; and a predictive calculation of the failure rate for the total population of capacitors from which the samples were selected based upon the number of failures that occurred during the life testing and the total number of equivalent component/device hours, which further takes into account an application voltage acceleration factor. Lastly, from the predicted failure rate calculation, the mean time between failures (MTBF) in hours can be determined.

First, to determine the equivalent component hours at the end use application temperature of the capacitors being screened, a test/screening temperature acceleration factor based and a test/screening voltage acceleration factor can be determined. Formula 1 below shows how the test/screening temperature acceleration factor (TTAF) can be determined, and includes converting the application and test temperatures into degrees Kelvin:

$$TTAF = e^{\left(\frac{Activation\ Energy}{Boltzman\ Constant}\right) \times \left(\left(\frac{1}{Application\ Temperature+273}\right)-\left(\frac{1}{Test\ Temperature+273}\right)\right)} \quad \text{(Formula 1)}$$

Meanwhile, formula 2 below shows how the test/screening voltage acceleration factor (TVAF) can be determined:

$$TVAF = \left(\frac{Test\ Voltage}{Rated\ Voltage}\right)^3 \quad \text{(Formula 2)}$$

Further, formula 3 below shows how the equivalent component hours at the capacitors' application temperature is determined:

Equivalent Component Hours at Application Temperature=(# Capacitors Tested)(Hours Tested)(TTAF)(TVAF) (Formula 3)

Next, the equivalent component hours can be converted into equivalent component years if desired. Then, an application voltage acceleration factor (AVAF) can be determined, as shown in formula 4 below:

$$AVAF = \left(\frac{Test\ Voltage}{Rated\ Voltage}\right)^3 \quad \text{(Formula 4)}$$

Now, using the calculations from the above formulas, the failure rate can be calculated, where the failure rate is shown in percent failures per 1000 hours. The failure rate is based a chi-squared distribution and includes determining the inverse of the one-tailed probability of the chi-squared distribution. Formula 5 shows the equation to determine the failure rate:

$$\text{Failure Rate (\% Per 1000 Hours)} = \left(\frac{CHIINV\left(\left(1-\left(\frac{\%\ Confidence\ Level}{100}\right)\right),\right)}{(2 \times Equivalent\ Component\ Hours)}\right) \times \left(\frac{AVAF}{2}\right) \times ((1000\ Hours) \times 100) \quad \text{(Formula 5)}$$

The "CHIINV" function calculates the Chi Squared Value of two factors—the confidence Level factor and the degrees of Freedom factor. The confidence Factor is 1 minus the input confidence level expressed as a decimal. The degrees of freedom factor is twice the sum of the number of failures observed during the life testing of the capacitors and one. This factor represents sample testing that is for a specific length of time, independent of the number of failures. The chi-squared value is then divided by twice the Equivalent Component Hours determined in formula 3. The result is then multiplied by the application voltage acceleration factor (AVAF) as determined in formula 4, after first dividing the AVAF by two. Next, this result is multiplied by a factor of 1000 times 100, or 100,000, to put the end predicted failure rate into "percent failures per 1000 hours."

After the predicted failure rate in percent failures per 1000 hours has been determined as shown above in Formula 5, the failure rate can be converted into the Mean Time Between Failures (MTBF) in hours as shown below in Formula 6:

$$MTBF = \left(\frac{1}{((Failure\ Rate\ in\ \%\ Per\ 1000\ Hours)/100)}\right) \times \quad \text{(Formula 6)}$$
$$(1000\ hours)$$

When formula 5 shown above is used after life testing to determine the predictive failure rate of capacitors screened according to the method of the present application, the predicted failure rate of the capacitors can range from about 0.000005% failures per 1000 hours to about 0.01% failures per 1000 hours, such as from about 0.000008% failures per 1000 hours to about 0.009% failures per 1000 hours, such as from about 0.00001% failures per 1000 hours to about 0.008% failures per 1000 hours when determined at a confidence level of from about 50% to about 99.9%, such as from about 55% to about 95%, such as from about 60% to about 90%. In one particular embodiment, the predicted failure rate of the capacitors can range about 0.00001% failures per 1000 hours to about 0.008% failures per 1000 hours at a confidence level of about 90%.

As discussed above, the capacitors screened by the method of the present invention can be solid or wet electrolytic capacitors. A solid electrolytic capacitor generally contains a capacitor element that includes an anode body, dielectric layer, and solid electrolyte. The capacitor may also contain an anode lead (e.g., ribbon, wire, sheet, etc.) that is electrically connected to the anode body for connection to an anode termination. The valve metal composition may contain a valve metal (i.e., metal that is capable of oxidation) or valve metal-based compound, such as tantalum, niobium, aluminum, hafnium, titanium, alloys thereof, oxides thereof, nitrides thereof, and so forth. For example, the valve metal composition may contain an electrically conductive oxide of niobium, such as niobium oxide having an atomic ratio of niobium to oxygen of $1:1.0\pm1.0$, in some embodiments $1:1.0\pm0.3$, in some embodiments $1:1.0\pm0.1$, and in some embodiments, $1:1.0\pm0.05$. For example, the niobium oxide may be $NbO_{0.7}$, $NbO_{1.0}$, $NbO_{1.1}$, and $NbO_2$. In one embodiment, a valve metal-based powder is employed that is compacted using any conventional powder press mold to form a porous anode body. Thereafter, the porous anode body is sintered to form a porous, integral body.

Once constructed, a dielectric layer may be formed by anodically oxidizing ("anodizing") the sintered anode body. This results in the formation of a dielectric layer that is formed over and/or within the pores of the anode body. For example, a tantalum (Ta) anode may be anodized to tantalum pentoxide ($Ta_2O_5$). Typically, anodization is performed by initially applying an electrolyte to the anode, such as by dipping the anode into the electrolyte. The capacitor element also contains a solid electrolyte that functions as the cathode for the capacitor.

In one embodiment, the cathode of a solid electrolytic capacitor can be made principally from manganese dioxide and is formed by a process generically termed manganizing. In this process, a conductive counter electrode coating is formed over the dielectric formed from anodizing. The manganizing step is typically performed by dipping the anodized device in a solution of manganous nitrate and heating the impregnated device in a moist atmosphere to convert the nitrate to a solid conductive manganese dioxide. In other words, a manganese dioxide solid electrolyte may be formed by the pyrolytic decomposition of manganous nitrate ($Mn(NO_3)_2$). Such capacitors having a cathode formed from manganese dioxide can operate at high temperatures, such as up to about 250° C., such as up to about 230° C., when the capacitor is a hermetically sealed capacitor, discussed in more detail below.

In another embodiment, the solid electrolyte may also be formed from one or more conductive polymer layers. The conductive polymer may include polypyrroles; polythiophenes, poly(3,4-ethylenedioxythiophene) (PEDT); polyanilines); polyacetylenes; poly-p-phenylenes; polyphenolates; etc.; and derivatives thereof. The anode part may also optionally be applied with a carbon layer (e.g., graphite) and silver layer, respectively. The silver coating may, for instance, act as a solderable conductor, contact layer, and/or charge collector for the capacitor and the carbon coating may limit contact of the silver coating with the solid electrolyte. Such coatings may cover some or all of the solid electrolyte.

Regardless of the particular manner in which the capacitor is formed, it can be connected to terminations as is well known in the art. For example, anode and cathode terminations may be electrically connected to the anode lead (e.g., a sheet or a wire) and the cathode, respectively. Generally speaking, it is desirable to electrically isolate the anode termination from the cathode termination so that the capacitor functions in the desired manner. To achieve such isolation, a variety of techniques may be implemented. In one embodiment, for instance, any oxide and/or cathode layer(s) formed on the lead may simply be removed through an etching process (e.g., chemical, laser, etc.).

As indicated above, the solid electrolytic capacitor that can be screened by the method of the present invention contains an anode termination to which the anode lead of the capacitor element is electrically connected and a cathode termination to which the cathode of the capacitor element is electrically connected. Any conductive material may be employed to form the terminations, such as a conductive metal. The terminations may be connected using any technique known in the art, such as welding, adhesive bonding, refractory metal paste, etc. Once the capacitor element is attached, the lead frame/terminations may be enclosed within a casing, which may then be filled with silica or any other known encapsulating material. The width and length of the case may vary depending on the intended application. Suitable casings may include but are not limited to for instance, "A", "B", "C", "D", "E", "F", "G", "H", "J", "K", "L", "M", "N", "P", "R", "S", "T", "V", "W", "Y", or "X" cases (AVX Corporation). Regardless of the case size employed, the capacitor element is encapsulated so that at least a portion of the anode and cathode terminations are exposed. After encapsulation, exposed portions of the anode and cathode terminations may be aged, screened, and trimmed to the desired size.

Figure 2:
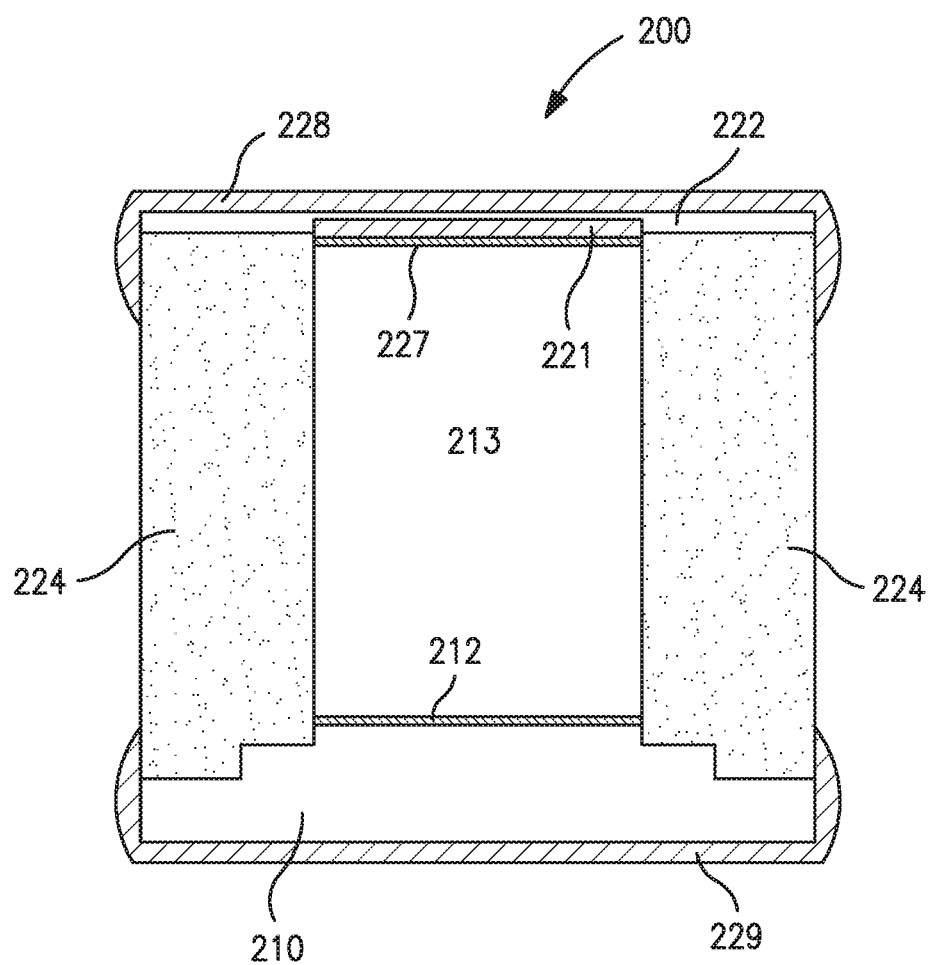
FIG. 2 is a cross-sectional view of one embodiment of a solid electrolytic capacitor that can be screened via the method of the present invention.
Figure 3:
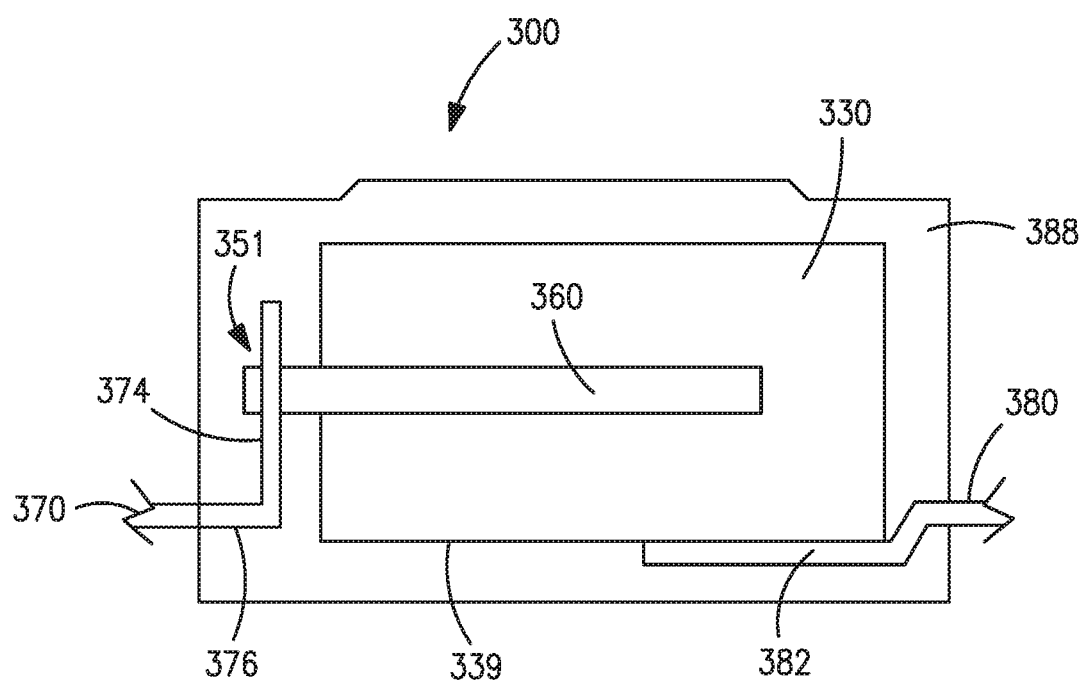
FIG. 3 is a cross-sectional view of another embodiment of a solid electrolytic capacitor that can be screened via the method of the present invention.

As discussed above, the anode lead may be in the form of a sheet or wire, etc., and may be formed from a valve metal compound such as tantalum, niobium, niobium oxide, etc. For example, the screening method of the present invention can be used to screen numerous embodiments of electrolytic capacitors, such as the solid electrolytic capacitors as shown in FIGS. 2 and 3. As shown in FIG. 2, the solid electrolytic capacitor can employ an anode lead that is the form of a sheet. Further, as shown in FIG. 3, the solid electrolytic capacitor can employ an anode lead that is in the form of a wire.

For instance, in one embodiment, the capacitor to be screened may employ a sheet (e.g., plate, foil, etc.) that is bonded to the anode body, as shown in FIG. 2. Various examples of such capacitors are described, for instance, in U.S. Pat. No. 5,357,399 to Salisbury; U.S. Pat. No. 6,751,085 to Huntington; U.S. Pat. No. 6,643,121 to Huntington; U.S. Pat. No. 6,849,292 to Huntington; U.S. Pat. No. 6,673,389 to Huntington; U.S. Pat. No. 6,813,140 to Huntington; and U.S. Pat. No. 6,699,767 to Huntington, which are incorporated herein in their entirety by reference thereto for all purposes. In FIG. 2, one embodiment of a solid electrolytic capacitor 200 that can be screened by the method of the present invention is shown that includes an anode lead 210 in the form of a sheet. The anode lead 210 is bonded to a compressed anode body 213 made from a valve metal composition (e.g., tantalum). Although other means of bonding can be used, in one particular embodiment, the anode lead 210 is bonded to the anode body 213 using an adhesive 212. The adhesive 212 may be initially applied to a surface of the anode lead 210. Thereafter, the compressed anode body 213 may be disposed over the adhesive 212. The anode body 213 and the anode lead 210 may then be sintered to cause a bond to form between the adhesive and the metal of both the anode body and the anode lead. Once attached, the anode body 213 may then be anodized and applied with a solid electrolyte as described above. If desired, additional layers may be employed, such as a carbon layer 227 and/or one or more silver layers 221 or 222, also as discussed above. The capacitor 200 may also include an encapsulating resin at side walls 224 that sheath the anode body 213. End caps 228 and 229 are provided as cathode and anode terminations, respectively, of the capacitor 200.

Another embodiment of a solid electrolytic capacitor that can be screened by the method of the present invention is shown in FIG. 3. The solid electrolytic capacitor 300 can employ an anode lead 360 that is in the form of a wire embedded in the porous anode body. In such an embodiment, after formation of the capacitor element, 330, anode and cathode terminations may be electrically connected to the anode wire 360 and the solid electrolyte layer 354. The specific configuration of the terminations may vary as is well known in the art. Referring to FIG. 3, for example, one embodiment is shown that includes an anode termination 370 and a cathode termination 380. In this particular embodiment, the cathode termination 380 contains a portion 382 in electrical contact with the lower surface 339 of the capacitor element 330. To attach the capacitor element 330 to the cathode termination 380, a conductive adhesive may be employed as is known in the art.

The anode termination 370 contains a first portion 376 positioned substantially perpendicular to a second portion 374. The second portion 374 contains a region 351 that carries the anode wire 360. If desired, the region 351 may possess a "U-shape" for further enhancing surface contact and mechanical stability of the wire 360. The anode wire 360 may then be welded to the region 351 with a laser or by any other suitable method. Once the capacitor element is attached to the terminations, it is enclosed within a resin casing, which may then be filled with silica or any other known encapsulating material. Referring again to FIG. 3, for example, one particular embodiment of such an encapsulating case for a capacitor 300 is shown as element 388. The encapsulating case 388 provides additional structural and thermal protection for the capacitor 300. After encapsulation, exposed portions of the respective anode and cathode terminations may be aged, screened, and trimmed. If desired, the exposed portions may be optionally bent twice along the outside of the casing 388 (e.g., at an approximately 90° angle).

Figure 27:
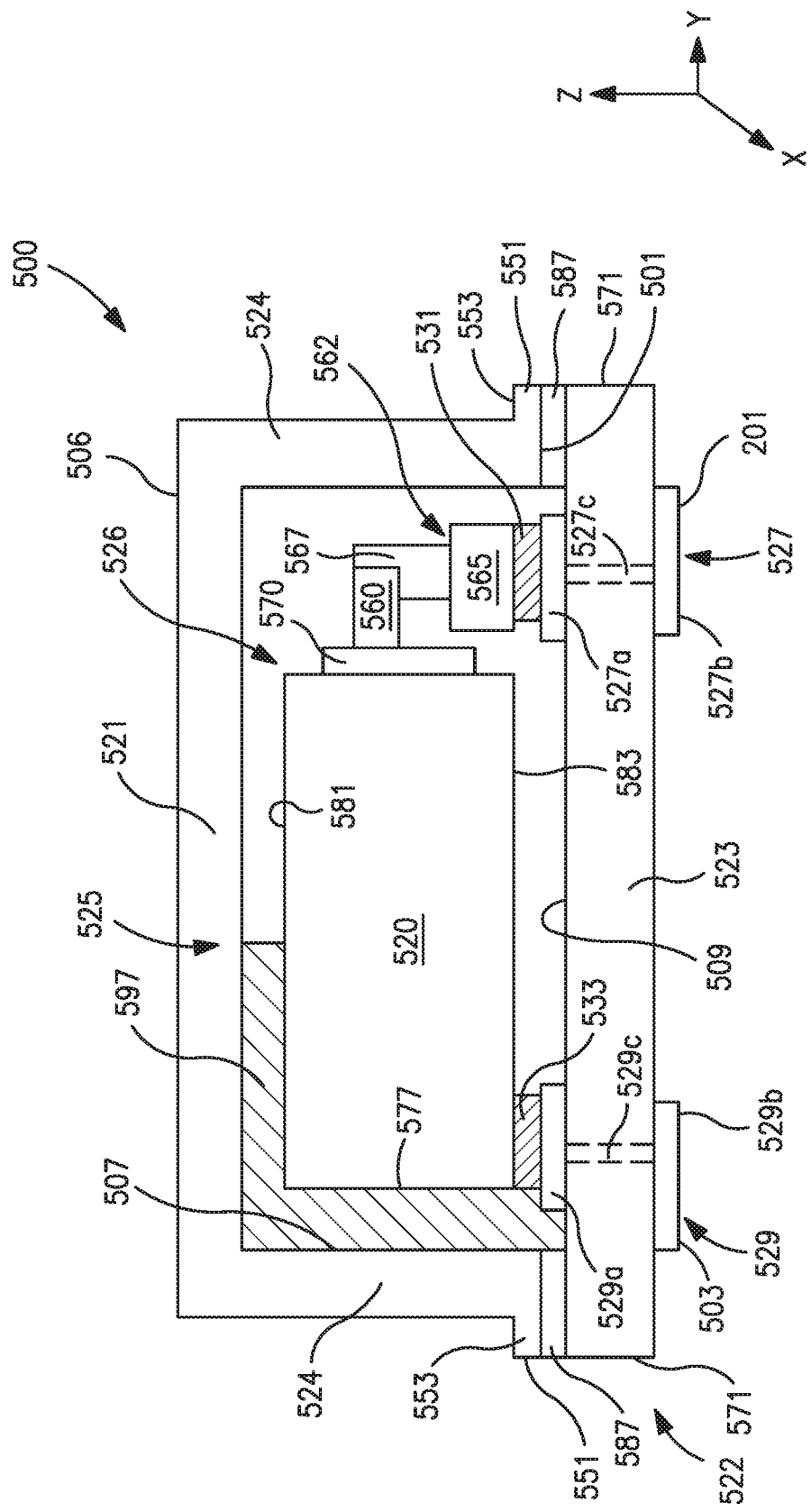
FIG. 27 is a cross-sectional view of one embodiment of a hermetically sealed capacitor that can be screened via the method of the present invention.

Another embodiment of a solid electrolytic capacitor that can be screened by the method of the present invention is a hermetically sealed capacitor, such as the capacitor shown in FIG. 27. As shown in FIG. 27, a solid electrolytic capacitor element 520 hermetically sealed within a housing 522 to form the capacitor 500. Any of a variety of different materials may be used to form the housing, such as metals, plastics, ceramics, and so forth. In one embodiment, for example, the housing includes one or more layers of a metal, such as tantalum, niobium, aluminum, nickel, hafnium, titanium, copper, silver, steel (e.g., stainless), alloys thereof (e.g., electrically conductive oxides), composites thereof (e.g., metal coated with electrically conductive oxide), and so forth. In another embodiment, the housing may include one or more layers of a ceramic material, such as aluminum nitride, aluminum oxide, silicon oxide, magnesium oxide, calcium oxide, glass, etc., as well as combinations thereof.

The housing may have any desired shape, such as cylindrical, D-shaped, rectangular, triangular, prismatic, etc. Referring to FIG. 27, for example, one embodiment of a capacitor assembly 500 is shown that contains a housing 522 and a capacitor element 520. To increase volumetric efficiency, the capacitor element 520 may have a length (excluding the length of the anode lead 560) that is relatively similar to the length of an interior cavity 526 defined by the housing 522. Further, it should be understood that even though only one capacitor element 520 is shown in FIG. 27, the housing 522 can include multiple capacitor elements 520. It should also be understood that each of the capacitor elements 520 can be screened by the method of the present disclosure separately before being hermetically sealed in the housing. In the alternative, it should also be understood that the capacitor elements 520 can be hermetically sealed in the housing 522, after which the capacitor assembly 500 itself can be screened by the method of the present disclosure.

Although by no means required, the capacitor element may be attached to the housing in such a manner that an anode termination and cathode termination are formed external to the housing for subsequent integration into a circuit. The particular configuration of the terminations may depend on the intended application. In one embodiment, for example, the capacitor assembly may be formed so that it is surface mountable, and yet still mechanically robust. For example, the anode lead may be electrically connected to external, surface mountable anode and cathode terminations (e.g., pads, sheets, plates, frames, etc.). Such terminations may extend through the housing to connect with the capacitor. The thickness or height of the terminations is generally selected to minimize the thickness of the capacitor assembly. If desired, the surface of the terminations may be electroplated with nickel, silver, gold, tin, etc. as is known in the art to ensure that the final part is mountable to the circuit board. In one particular embodiment, the termination(s) are deposited with nickel and silver flashes, respectively, and the mounting surface is also plated with a tin solder layer. In another embodiment, the termination(s) are deposited with thin outer metal layers (e.g., gold) onto a base metal layer (e.g., copper alloy) to further increase conductivity.

In certain embodiments, connective members may be employed within the interior cavity of the housing to facilitate connection to the terminations in a mechanically stable manner. For example, referring again to FIG. 27, the capacitor assembly 500 may include a connection member 562 that is formed from a first portion 567 and a second portion 565. The connection member 562 may be formed from conductive materials similar to the external terminations. The first portion 567 and second portion 565 may be integral or separate pieces that are connected together, either directly or via an additional conductive element (e.g., metal). In the illustrated embodiment, the second portion 565 is provided in a plane that is generally parallel to a lateral direction in which the lead 560 extends (e.g., −y direction). The first portion 567 is "upstanding" in the sense that it is provided in a plane that is generally perpendicular the lateral direction in which the lead 560 extends. In this manner, the first portion 567 can limit movement of the lead 560 in the horizontal direction to enhance surface contact and mechanical stability during use. If desired, an insulative material 570 (e.g., Teflon™ washer) may be employed around the lead 560.

The first portion 567 may possess a mounting region (not shown) that is connected to the anode lead 560. The region may have a "U-shape" for further enhancing surface contact and mechanical stability of the lead 560. Connection of the region to the lead 560 may be accomplished using any of a variety of known techniques, such as welding, laser welding, conductive adhesives, etc. In one particular embodiment, for example, the region is laser welded to the anode lead 560. Regardless of the technique chosen, however, the first portion 567 can hold the anode lead 560 in substantial horizontal alignment to further enhance the dimensional stability of the capacitor assembly 500.

Referring again to FIG. 27, one embodiment of the present invention is shown in which the connective member 562 and capacitor element 520 are connected to the housing 522 through anode and cathode terminations 527 and 529, respectively. The anode termination 527 contains a first region 527a that is positioned within the housing 522 and electrically connected to the connection member 562 and a second region 527b that is positioned external to the housing 522 and provides a mounting surface 201. Likewise, the cathode termination 529 contains a first region 529a that is positioned within the housing 522 and electrically connected to the solid electrolyte of the capacitor element 520 and a second region 529b that is positioned external to the housing 522 and provides a mounting surface 503. It should be understood that the entire portion of such regions need not be positioned within or external to the housing.

In the illustrated embodiment, a conductive trace 527c extends in a base 523 of the housing to connect the first region 527a and second region 527b. Similarly, a conductive trace 529c extends in the base 523 of the housing to connect the first region 527a and second region 527b. The conductive traces and/or regions of the terminations may be separate or integral. In addition to extending through the outer wall of the housing, the traces may also be positioned at other locations, such as external to the outer wall. Of course, the present invention is by no means limited to the use of conductive traces for forming the desired terminations.

Regardless of the particular configuration employed, connection of the terminations 527 and 529 to the capacitor element 520 may be made using any known technique, such as welding, laser welding, conductive adhesives, etc. In one particular embodiment, for example, a conductive adhesive 531 is used to connect the second portion 565 of the connection member 562 to the anode termination 527. Likewise, a conductive adhesive 533 is used to connect the cathode of the capacitor element 520 to the cathode termination 529. The conductive adhesives may be formed from conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives are described in U.S. Patent Application Publication No. 2006/0038304 to Osako, et al., which is incorporated herein in its entirety by reference thereto for all purposes.

Optionally, a polymeric restraint may also be disposed in contact with one or more surfaces of the capacitor element, such as the rear surface, front surface, upper surface, lower surface, side surface(s), or any combination thereof. The polymeric restraint can reduce the likelihood of delamination by the capacitor element from the housing. In this regard, the polymeric restraint may possesses a certain degree of strength that allows it to retain the capacitor element in a relatively fixed positioned even when it is subjected to vibrational forces, yet is not so strong that it cracks. For example, the restraint may possess a tensile strength of from about 1 to about 150 Megapascals ("MPa"), in some embodiments from about 2 to about 100 MPa, in some embodiments from about 10 to about 80 MPa, and in some embodiments, from about 20 to about 70 MPa, measured at a temperature of about 25° C. It is normally desired that the restraint is not electrically conductive.

Although any of a variety of materials may be employed that have the desired strength properties noted above, curable thermosetting resins have been found to be particularly suitable for use in the present invention. Examples of such resins include, for instance, epoxy resins, polyimides, melamine resins, urea-formaldehyde resins, polyurethanes, silicone polymers, phenolic resins, etc. In certain embodiments, for example, the restraint may employ one or more polyorganosiloxanes. Epoxy resins are also particularly suitable for use as the polymeric restraint. Still other suitable conductive adhesive resins may also be described in U.S. Patent Application Publication No. 2006/0038304 to Osako, et al. and U.S. Pat. No. 7,554,793 to Chacko, which are incorporated herein in their entirety by reference thereto for all purposes.

If desired, curing agents may also be employed in the polymeric restraint to help promote curing. The curing agents typically constitute from about 0.1 to about 20 wt. % of the restraint. Still other additives may also be employed, such as photoinitiators, viscosity modifiers, suspension aiding agents, pigments, stress reducing agents, coupling agents (e.g., silane coupling agents), nonconductive fillers (e.g., clay, silica, alumina, etc.), stabilizers, etc. When employed, such additives typically constitute from about 0.1 to about 20 wt. % of the total composition.

Referring again to FIG. 27, for instance, one embodiment is shown in which a single polymeric restraint 597 is disposed in contact with an upper surface 581 and rear surface 577 of the capacitor element 520. While a single restraint is shown in FIG. 27, it should be understood that separate restraints may be employed to accomplish the same function. In fact, more generally, any number of polymeric restraints may be employed to contact any desired surface of the capacitor element. When multiple restraints are employed, they may be in contact with each other or remain physically separated. For example, in one embodiment, a second polymeric restraint (not shown) may be employed that contacts the upper surface 581 and front surface 579 of the capacitor element 520. The first polymeric restraint 597 and the second polymeric restraint (not shown) may or may not be in contact with each other. In yet another embodiment, a polymeric restraint may also contact a lower surface 583 and/or side surface(s) of the capacitor element 520, either in conjunction with or in lieu of other surfaces.

Regardless of how it is applied, it is typically desired that the polymeric restraint is also in contact with at least one surface of the housing to help further mechanically stabilize the capacitor element against possible delamination. For example, the restraint may be in contact with an interior surface of one or more sidewall(s), outer wall, lid, etc. In FIG. 27, for example, the polymeric restraint 597 is in contact with interior surfaces 507 and 509 of the housing 522. While in contact with the housing, it is nevertheless desired that at least a portion of the cavity defined by the housing remains unoccupied to allow for the inert gas to flow through the cavity and limit contact of the solid electrolyte with oxygen. For example, at least about 5% of the cavity volume typically remains unoccupied by the capacitor element and polymer restraint, and in some embodiments, from about 10% to about 50% of the cavity volume.

Once connected in the desired manner, the resulting package is hermetically sealed. Referring again to FIG. 27, for instance, the housing 522 includes a base 523 and a lid 525 between which the cavity 526 is formed. The lid 525 and base 523 may be formed from a ceramic, metal (e.g., iron, copper, nickel, cobalt, etc., as well as alloys thereof), plastic, and so forth. In one embodiment, for example, the base 523 is formed from a ceramic material and the lid 525 is formed from a metal material. The lid 525 includes an outer wall 521 that is integral with at least one sidewall 524. In the illustrated embodiment, for example, two opposing sidewalls 524 are shown in cross-section. The height of the sidewall(s) 524 is generally such that the lid 525 does not contact any surface of the capacitor element 520 so that it is not contaminated. The outer wall 521 and base 523 both extend in a lateral direction (−y direction) and are generally parallel with each other and to the lateral direction of the anode lead 560. The sidewall 524 extends from the outer wall 521 in a longitudinal direction that is generally perpendicular to the base 523. A distal end 506 of the lid 525 is defined by the outer wall 521 and a proximal end 501 is defined by a lip 553 of the sidewall 524.

More particularly, the lip 553 extends from the sidewall 524 in the lateral direction, which may be generally parallel to the lateral direction of the base 523. The lip 553 also defines a peripheral edge 551, which may be generally perpendicular to the lateral direction in which the lip 553 and base 523 extend. The peripheral edge 551 is located beyond the outer periphery of the sidewall 524 and may be generally coplanar with an edge 571 of the base 523. The lip 553 may be sealed to the base 523 using any known technique, such as welding (e.g., resistance or laser), soldering, glue, etc. For example, in the illustrated embodiment, a sealing member 587 is employed (e.g., glass-to-metal seal, Kovar® ring, etc.) between the components to facilitate their attachment. Regardless, the use of a lip described above can enable a more stable connection between the components and improve the seal and mechanical stability of the capacitor assembly.

Hermetic sealing typically occurs in the presence of a gaseous atmosphere that contains at least one inert gas so as to inhibit oxidation of the solid electrolyte during use. The inert gas may include, for instance, nitrogen, helium, argon, xenon, neon, krypton, radon, and so forth, as well as mixtures thereof. Typically, inert gases constitute the majority of the atmosphere within the housing, such as from about 50 wt. % to 100 wt. %, in some embodiments from about 75 wt. % to 100 wt. %, and in some embodiments, from about 90 wt. % to about 99 wt. % of the atmosphere. If desired, a relatively small amount of non-inert gases may also be employed, such as carbon dioxide, oxygen, water vapor, etc. In such cases, however, the non-inert gases typically constitute 15 wt. % or less, in some embodiments 10 wt. % or less, in some embodiments about 5 wt. % or less, in some embodiments about 1 wt. % or less, and in some embodiments, from about 0.01 wt. % to about 1 wt. % of the atmosphere within the housing. For example, the moisture content (expressed in terms of relatively humidity) may be about 10% or less, in some embodiments about 5% or less, in some embodiments about 1% or less, and in some embodiments, from about 0.01 to about 5%.

Figure 4:
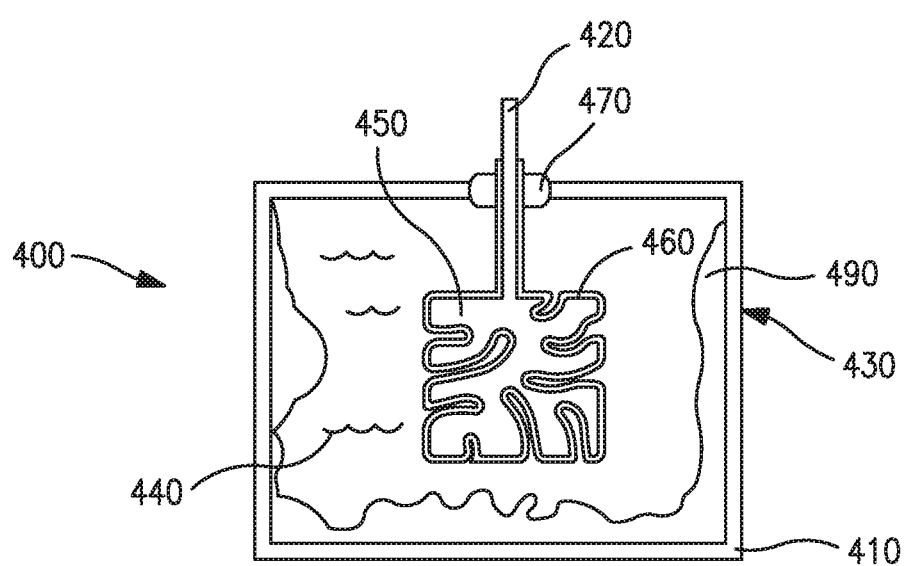
FIG. 4 is a cross-sectional view of one embodiment of a wet electrolytic capacitor that can be screened via the method of the present invention.

As discussed above, the screening method of the present invention can also be used to screen wet electrolytic capacitors. A wet electrolytic capacitor generally includes a porous anode body containing a dielectric layer, a cathode containing a metal substrate coated with an electrochemically active coating (e.g., conductive polymer), and an aqueous electrolyte. The ionic conductivity of the electrolyte is selectively controlled within a particular range so that the capacitor can be charged to a high voltage. The physical arrangement of the anode, cathode, and working electrolyte of a wet electrolytic capacitor screened by the method of the present invention may generally vary as is well known in the art. Referring to FIG. 4, for example, one embodiment of a wet electrolytic capacitor 400 is shown that includes a working electrolyte 440 disposed between an anode 450 and a cathode 430. The anode 450 contains a dielectric film 460 and is embedded with a lead 420 (e.g., tantalum wire). The cathode 430 may be formed from a cathode substrate 410 and an electrochemically-active material 490. Although not shown, a separator may be positioned between the cathode 430 and anode 450 to prevent direct contact between the anode and cathode, yet permit ionic current flow of working electrolyte 440 to the electrodes. A seal 470 (e.g., glass-to-metal) may also be employed that connects and seals the anode 450 to the cathode 430. Although not shown, the capacitor 400 may also include a spacer (not shown) that holds the anode 450 steady within the cathode 430. The spacer may, for example, be made of plastic and may be washer-shaped.

Figure 5:
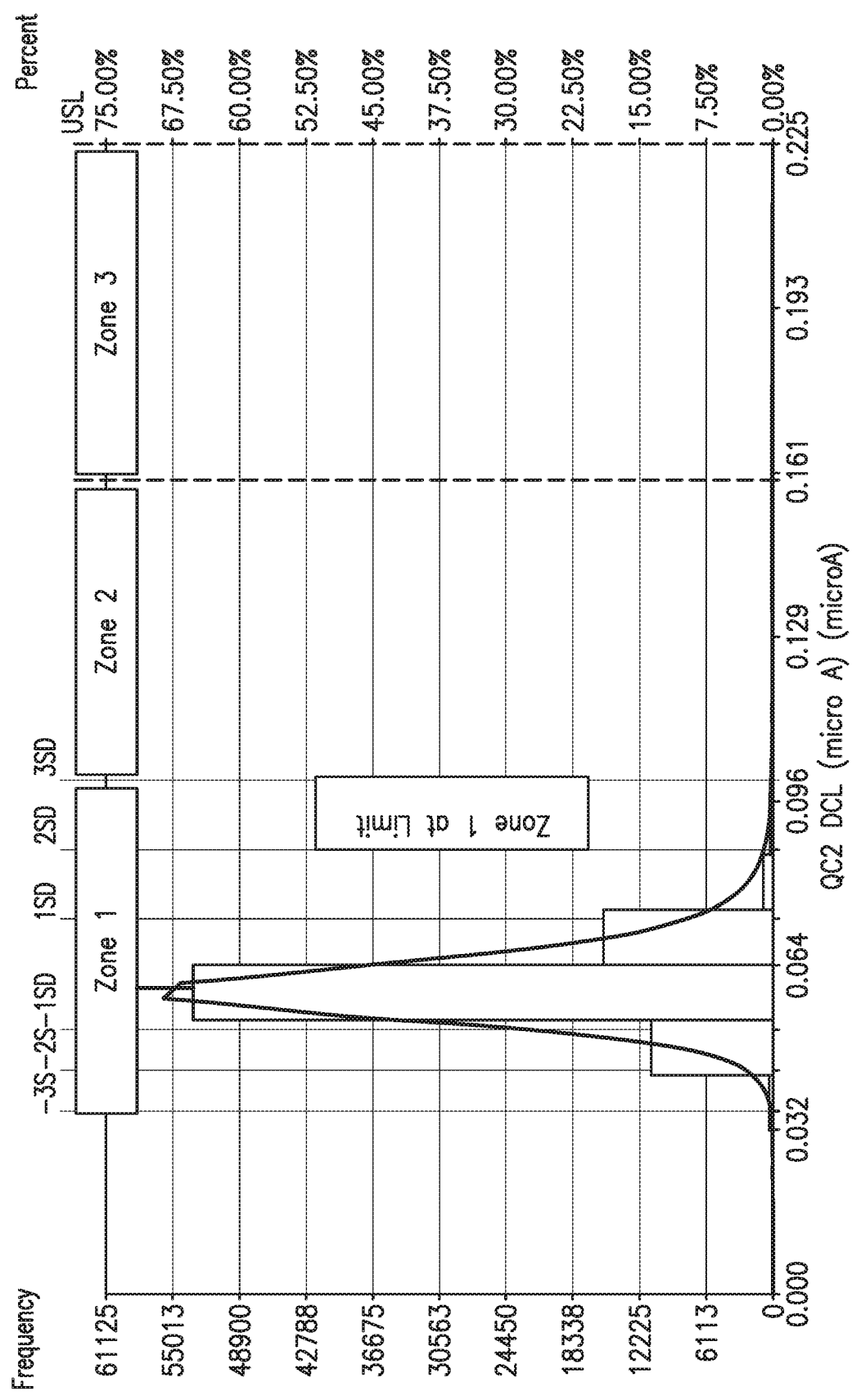
FIG. 5 is a graph plotting the first leakage currents for sample of capacitors and separating the leakage currents into three zones.

The present invention may be better understood by reference to the following examples, which refer to FIGS. 5-25 and show the effectiveness and reliability of the electrolytic capacitor screening method of the present invention. Examples 1-3 and 10 use FIG. 5 as a starting point, which plots the first leakage currents for all of the capacitors tested in 10 lots and separates them into zones. "Zone 1" includes parts that have a first leakage current that is within three standard deviations of the first mean leakage current, which, in this case, is measured at a temperature of 125° C. and at a voltage that is ⅔ the rated voltage. "Zone 1 at Limit" includes parts that have a first leakage current that is within three standard deviations of the first mean leakage current but are close to the limit. "Zone 2" includes parts that have a first leakage current above three standard deviations of the first mean leakage current. However, the capacitors in "Zone 2" have a first leakage current that is less than the hard cut limit of $0.001*C*V_R*12$. Note that the hard cut limit is calculated from the following equation:

$$\text{DCL Limit} = 0.001 * \text{Capacitance}(C) * \text{Rated Voltage}(V_R) * \text{Temperature Factor}(TF),$$

where the TF is 12 for and 125° C. Hence, the constant, which is 0.001 in calculating the leakage current limit used in FIG. 5, is multiplied by the product of the capacitance and the rated voltage ($V_R$), and is further multiplied by a factor of 12 to account for an elevated temperature of 125° C. Note that the constant used can be 0.01 for commercial or military applications, while the constant used can be 0.001 in medical or aerospace applications. In FIG. 5, the resulting hard cut limit based on the variables described above or product design capability is 0.225 µA. Meanwhile, "Zone 3" includes capacitors having a first leakage current that is both above three standard deviations of the first mean leakage current and greater than the hard cut limit of $0.001*C*V_R*12$.

EXAMPLE 1

125° C. ⅔ Rated Voltage Life Testing

Referring to FIGS. 6-9, 100 capacitors per lot from 10 lots falling into "Zone 1" in FIG. 5 above were burned-in at 125° C. for a period of 42 hours at 1.0 times the rated voltage of the capacitors. The parts were then mounted on FR-4 boards and subjected to a 1000 hour life test at 125° C. and ⅔ rated voltage. The leakage current (DCL) was then determined at a temperature of 25° C. and at the rated voltage for the parts after completion of the 1000 hour test.

Figure 6:
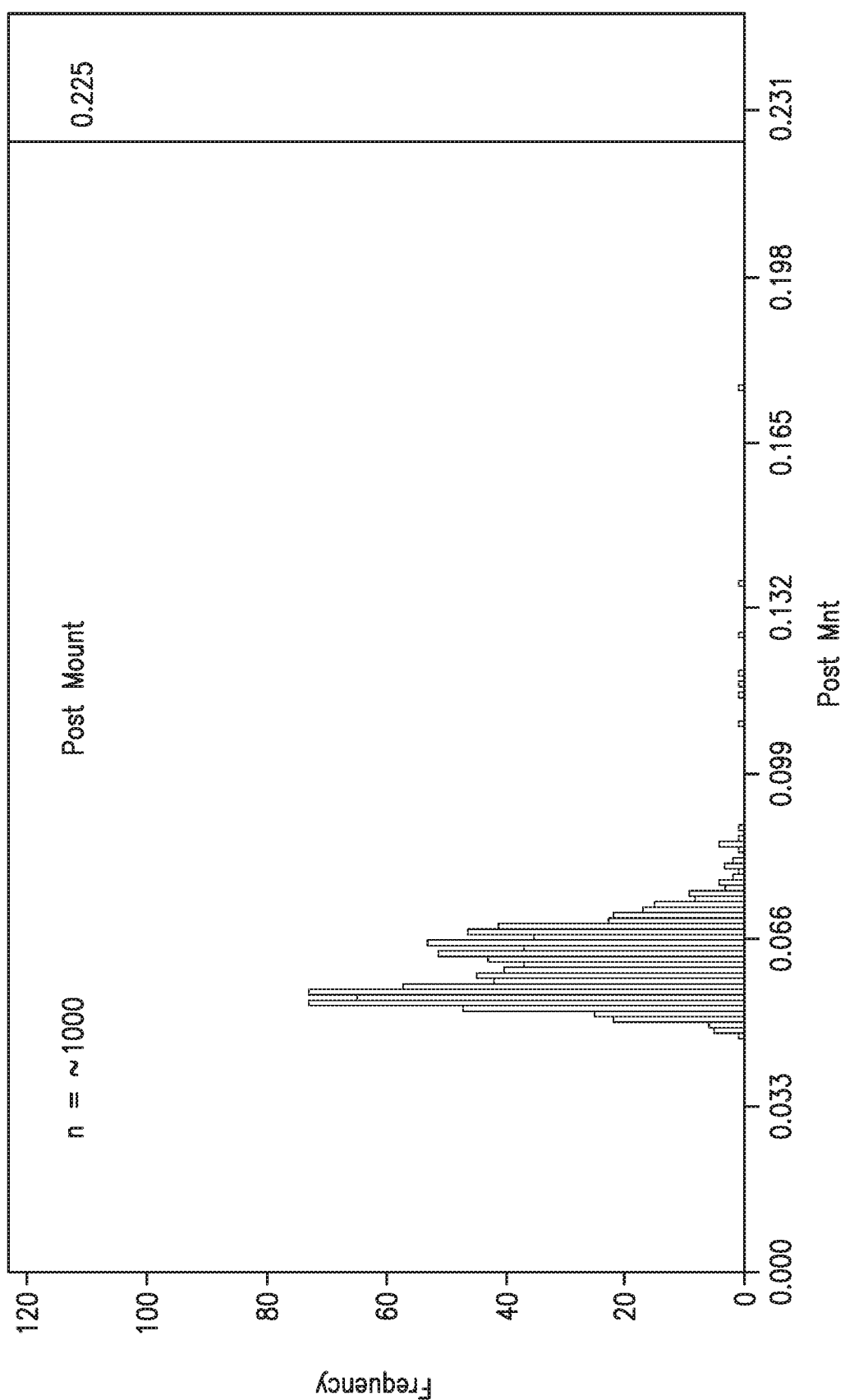
FIG. 6 is a graph showing the post-mount leakage current of the "Zone 1" parts of FIG. 5.

As seen in FIG. 6, the "Zone 1" capacitors of FIG. 5 overall exhibited a slightly higher leakage current in FIG. 6 post-mounting compared to FIG. 5, which, as discussed above, represents the first leakage current determination.

Figure 7:
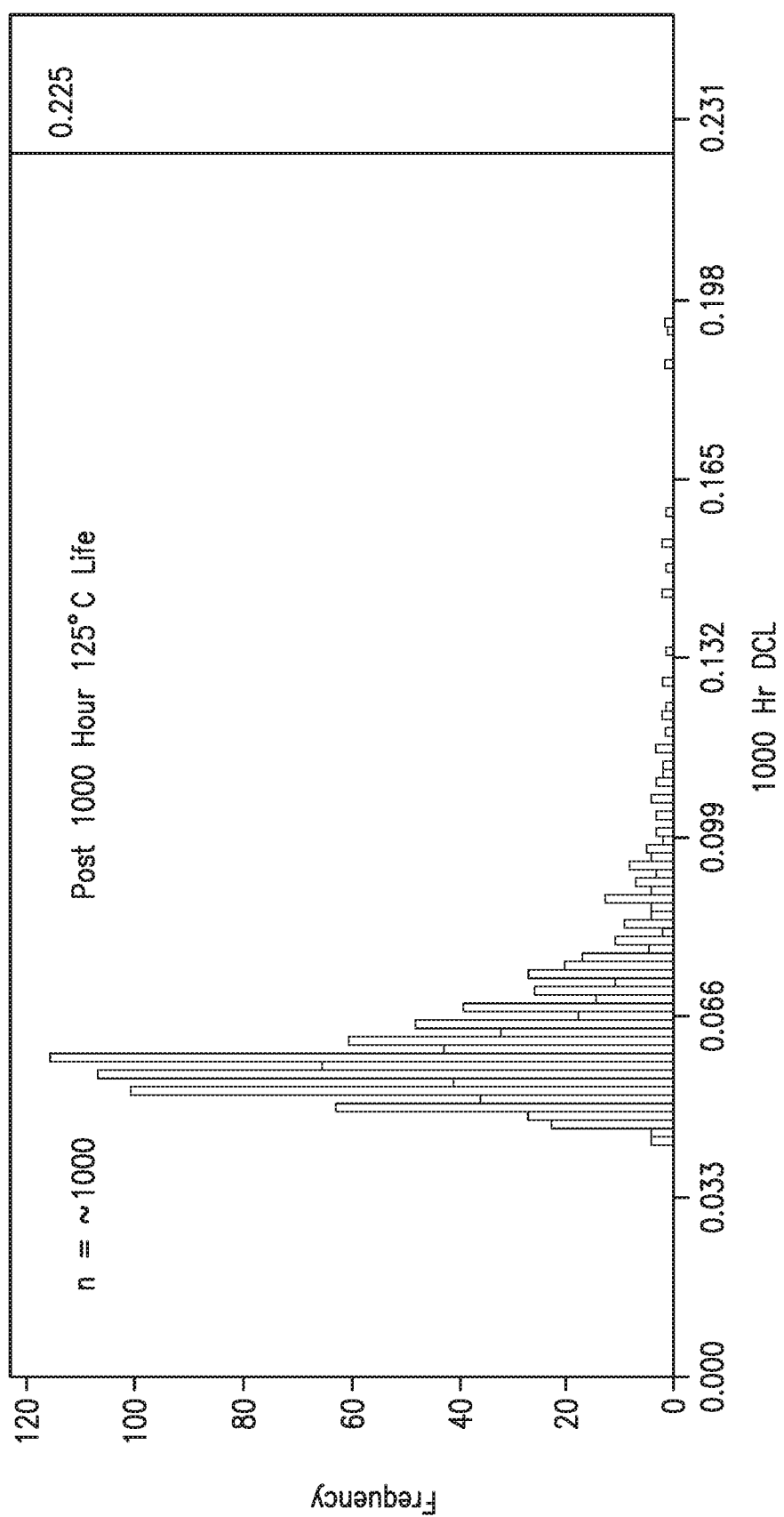
FIG. 7 is a graph showing the leakage current of the "Zone 1" parts of FIG. 5 after undergoing an 1000 hour 125° C. life test at ⅔ rated voltage.

However, the capacitors have a leakage current that is still below the predetermined 0.225 µA hard cut/failure limit for the capacitors. Likewise, as seen in FIG. 7, at the end of the 1000 hour 125° C. life test at ⅔ rated voltage, the "Zone 1" capacitors of FIG. 5 overall exhibited a slightly higher leakage current in FIG. 7 compared to FIGS. 5 and 6. However, the capacitors have a leakage current that is still below the 0.225 µA failure limit for the capacitors.

Figure 8:
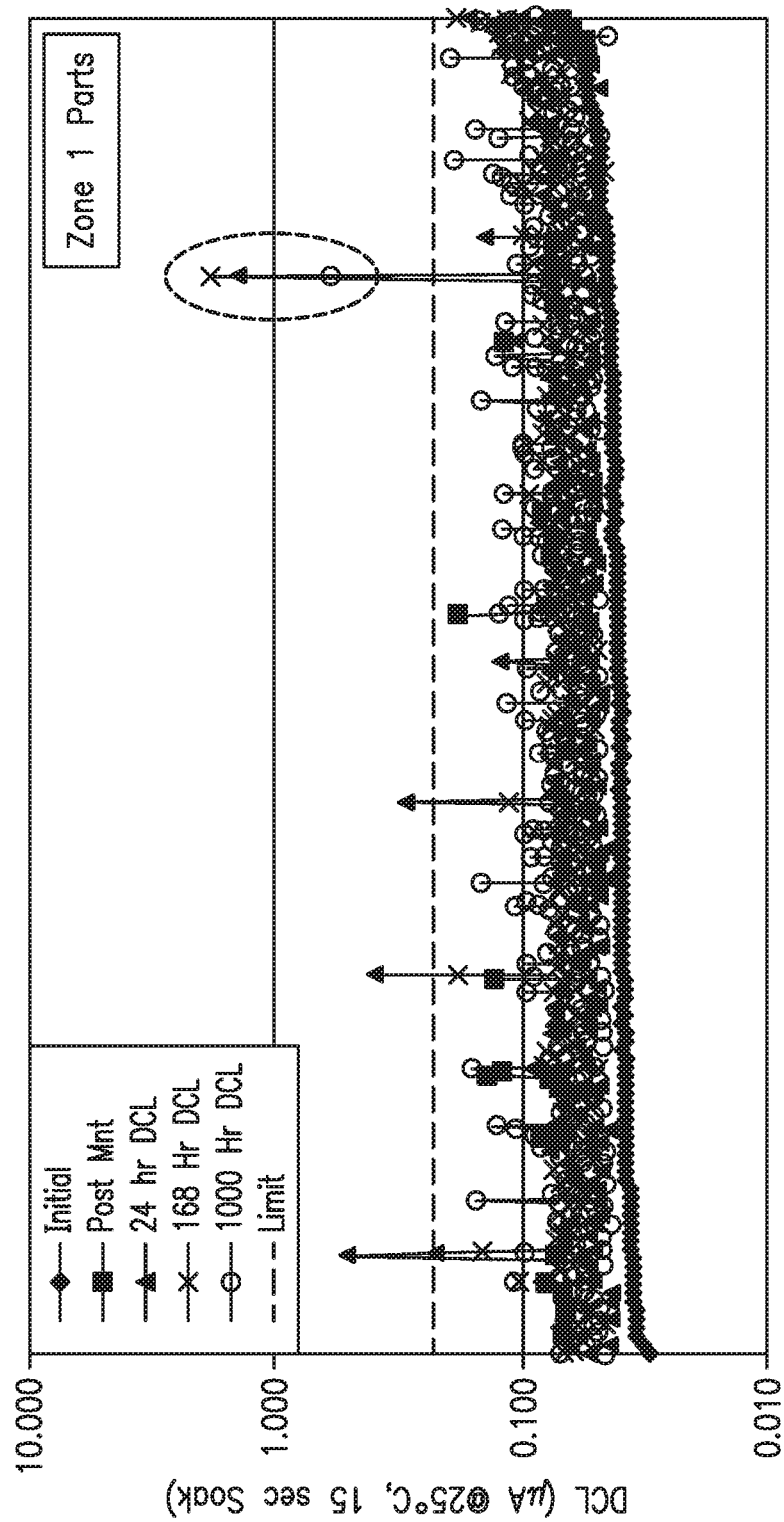
FIG. 8 is a graph comparing the leakage current for each of the "Zone 1" capacitors subjected to 1000 hour life testing at 125° C. at ⅔ rated voltage at various stages of the life testing.

Meanwhile, FIG. 8 shows the leakage current measurements for the capacitors of "Zone 1" as determined at various time points during life testing. One capacitor failed by exhibiting a leakage current above the 0.225 µA limit throughout the testing, as indicated by the dashed oval, while three other capacitors exhibited leakage currents above the 0.225 µA limit at the 24 hour DCL leakage current measurement but stabilized upon further life testing up to 1000 hours. Note that these failed capacitors would have been removed using the screening method of the present invention, but testing was continued on the failed capacitors to see how they would behave upon long term testing. As shown, the leakage current for a few of the capacitors was above the cutoff limit during testing but then fell below the cutoff limit at the end of testing. Thus, not following the screening method of the present invention and only looking at end point life testing data could result in accepting capacitors that have unstable characteristics.

Figure 9:
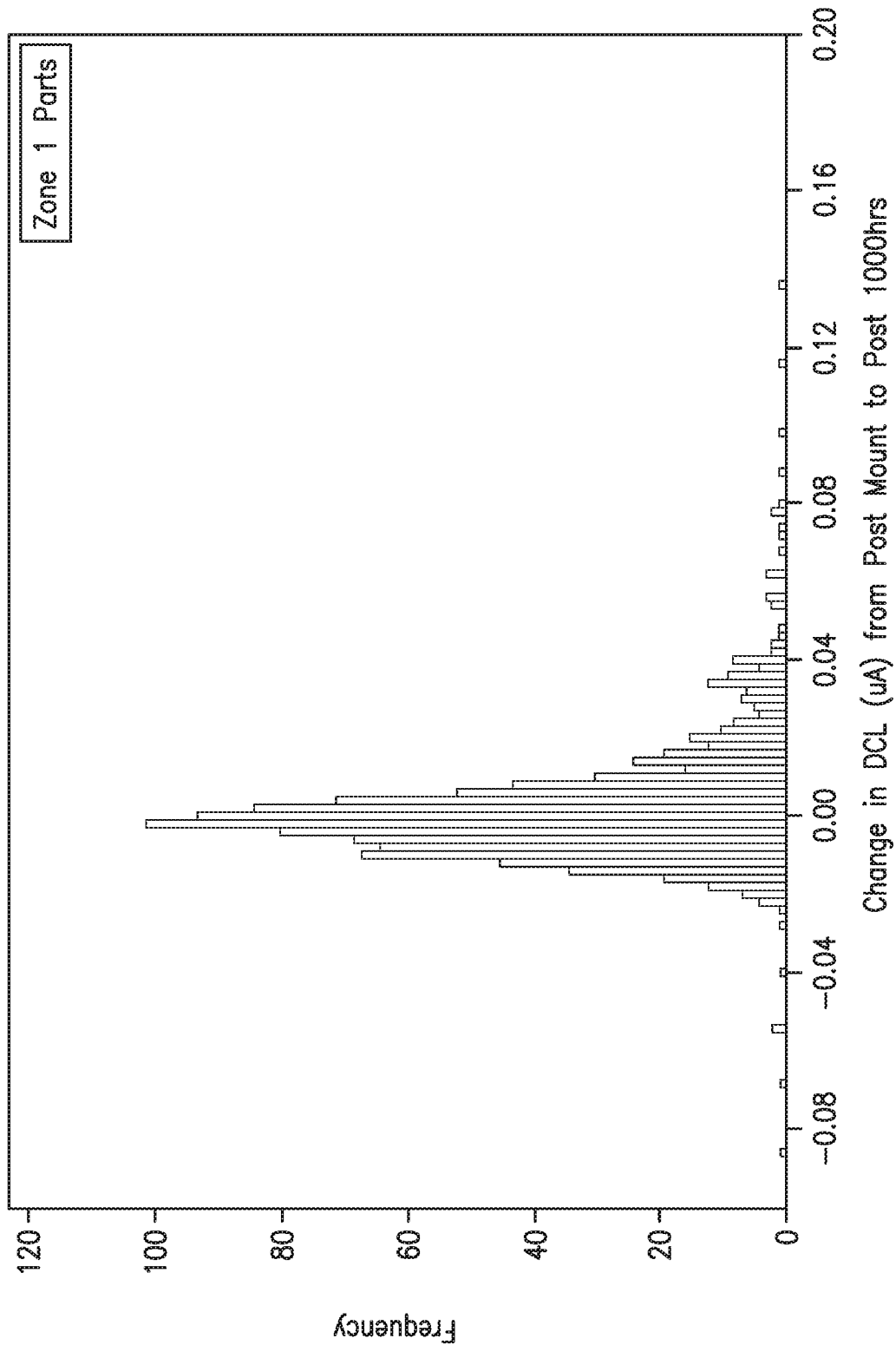
FIG. 9 is a graph showing the change in leakage current for each of the capacitors from FIG. 6 to FIG. 7.
Figure 10:
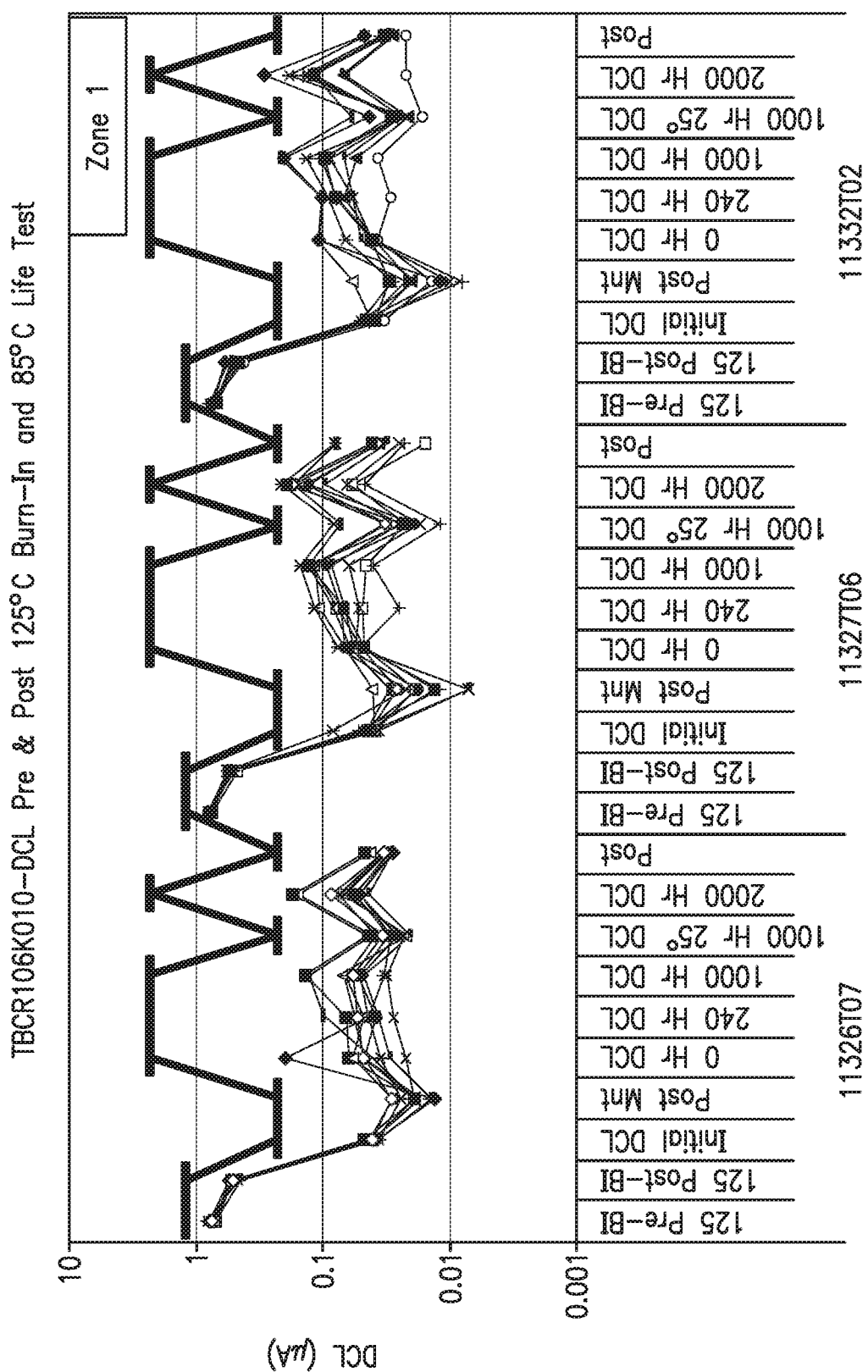
FIG. 10 is a graph showing the leakage current of 3 different lots of "Zone 1" capacitors subjected to 125° C. burn in and then 2000 hour life testing at 85° C. at rated voltage at various stages of the life testing.
Figure 11:
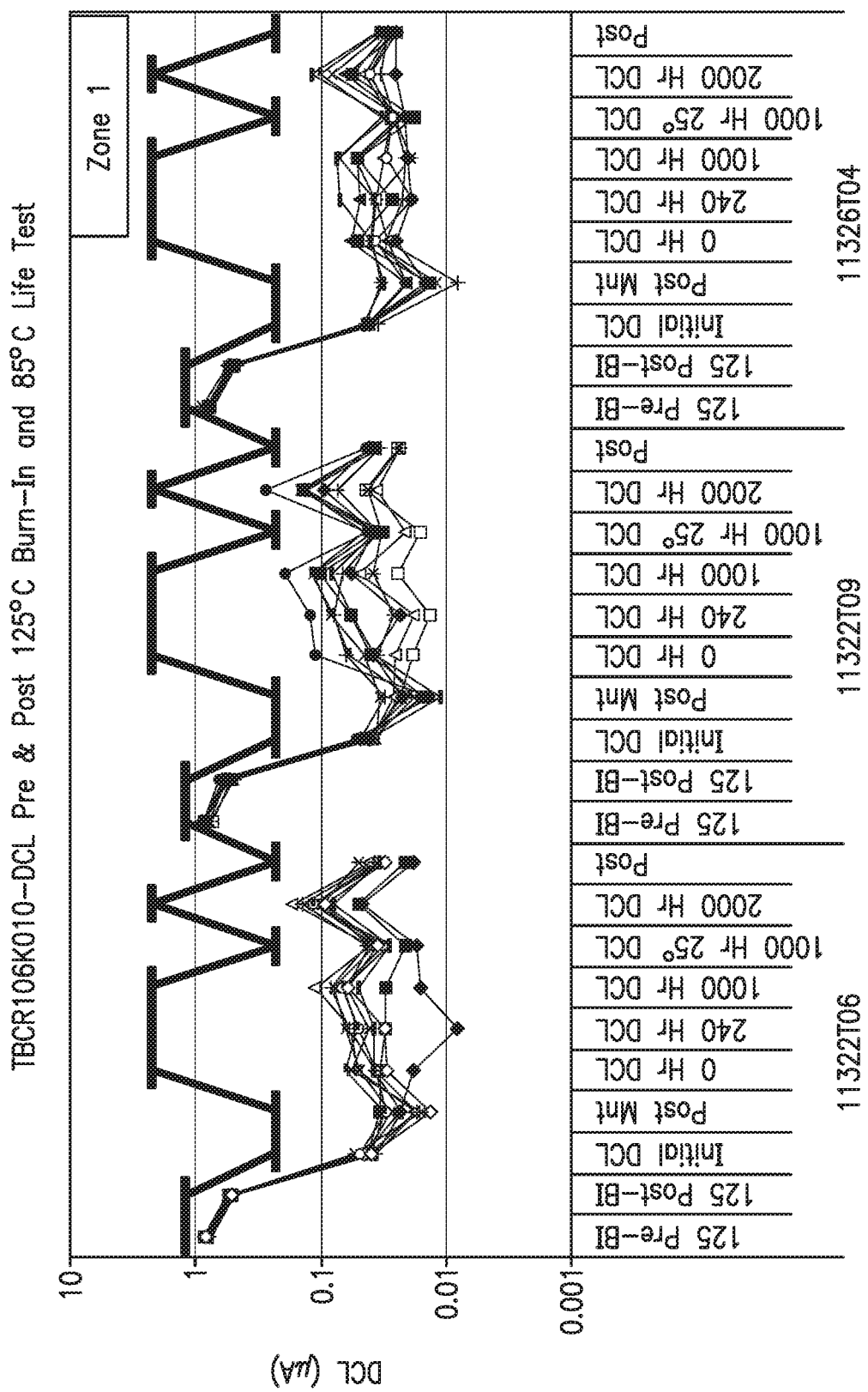
FIG. 11 is a graph showing the leakage current of 3 different lots of "Zone 1" capacitors subjected to 125° C. burn in and then 2000 hour life testing at 85° C. at rated voltage at various stages of the life testing.
Figure 12:
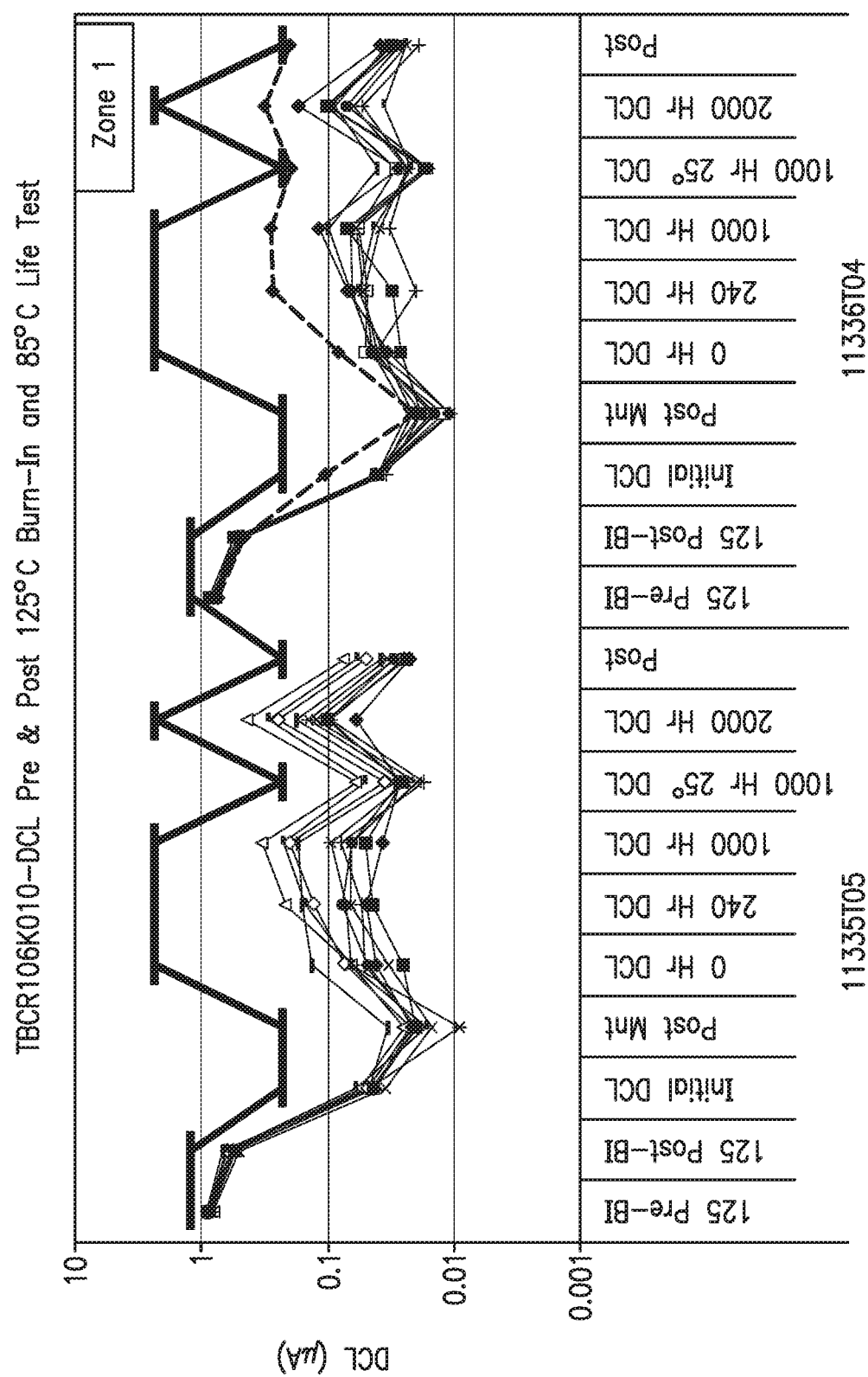
FIG. 12 is a graph showing the leakage current of 2 different lots of "Zone 1" capacitors subjected to 125° C. burn in and then 2000 hour life testing at 85° C. at rated voltage at various stages of the life testing.
Figure 13:
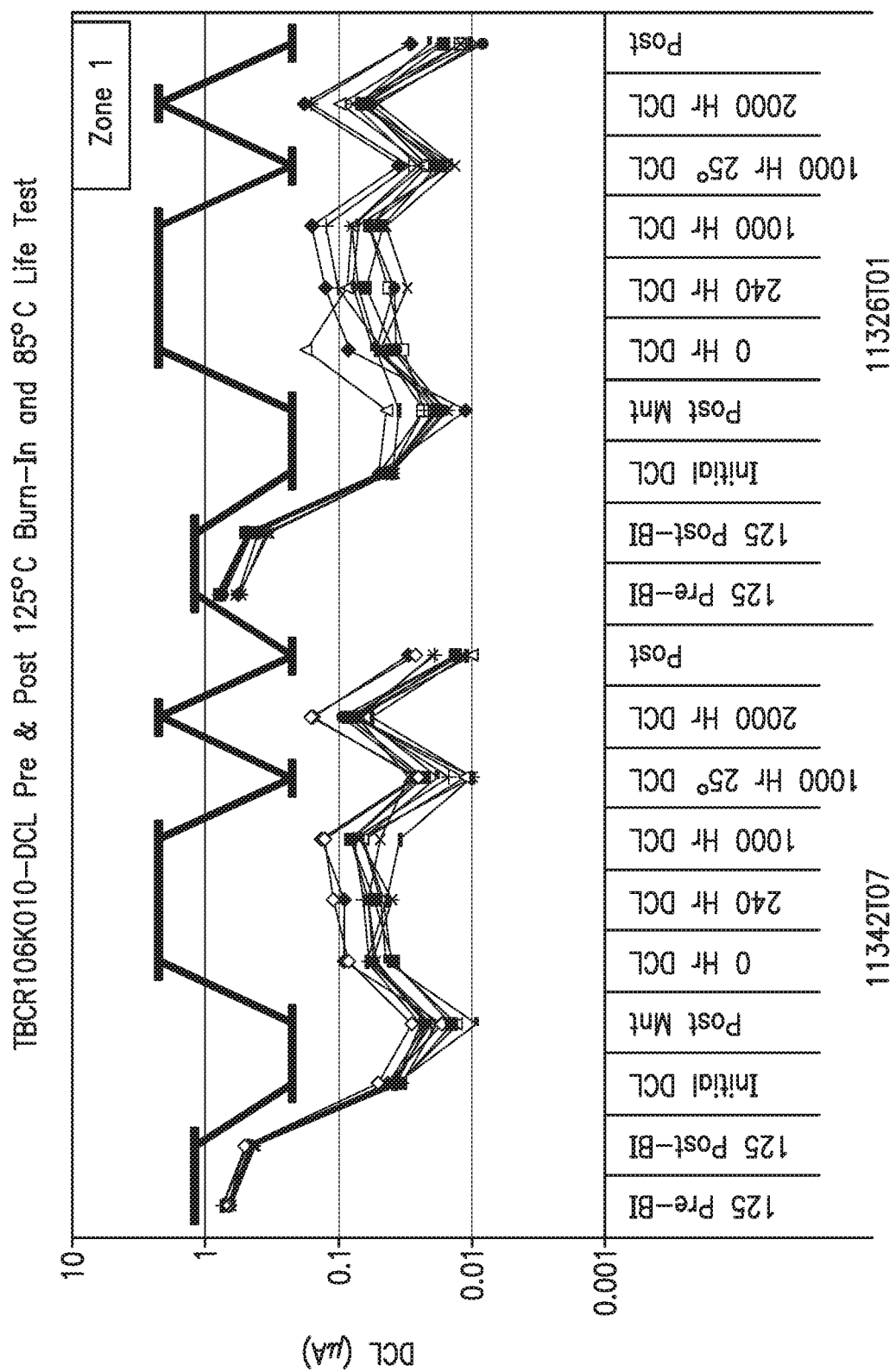
FIG. 13 is a graph showing the leakage current of 2 different lots of "Zone 1" capacitors subjected to 125° C. burn in and then 2000 hour life testing at 85° C. at rated voltage at various stages of the life testing.

Next, FIG. 9 shows the change in leakage current (DCL) for each of the "Zone 1" parts subjected to 1000 hour life testing at 125° C. at ⅔ rated voltage of FIG. 7 as compared to the post-mounting leakage current of FIG. 6. As shown, the graph of the DCL shift observed during the 1000 hour 125° C. test is represented by a well-behaved population with a negligible mean DCL shift.

EXAMPLE 2

85° C. Rated Voltage Life Testing

Referring to FIGS. 10-13, 10 capacitors per lot from 10 lots falling into "Zone 1" in FIG. 5 above were burned-in at 125° C. for a period of 42 hours at 1.0 times the rated voltage of the capacitors. The parts were then mounted on FR-4 boards and subjected to a 2000 hour life test at 85° C. and rated voltage. The leakage current (DCL) was then determined for the parts at various stages of the 2000 hour life test. As seen from the 10 graphs representative of the 10 lots, all capacitors were below the DCL cutoff limit (as shown by the bold line) after 2000 hours of life testing, indicating that the iterative screening method of the pending claims is effective in removing unstable capacitors from the lots tested. Note that the cutoff limit is calculated from the following equation:

DCL Limit=0.0025*Capacitance($C$)*Rated Voltage ($V_R$)*Temperature Factor(TF), where the TF is 1 for 25° C., 10 for 85° C., and 12 for and 125° C.)

EXAMPLE 3

85° C. Rated Voltage Life Testing, Non-Standard Population

Next, individual capacitors with marginal or anomalous performance through 125° C. burn in were captured, categorized into "Zone 1 at Limit" (i.e., FIG. 14), "Zone 2 to Zone 1 Movers" (i.e., FIG. 15), or "Zone 2" (i.e., FIG. 16) parts, and subjected to 85° C. life testing at rated voltage.

Figure 14:
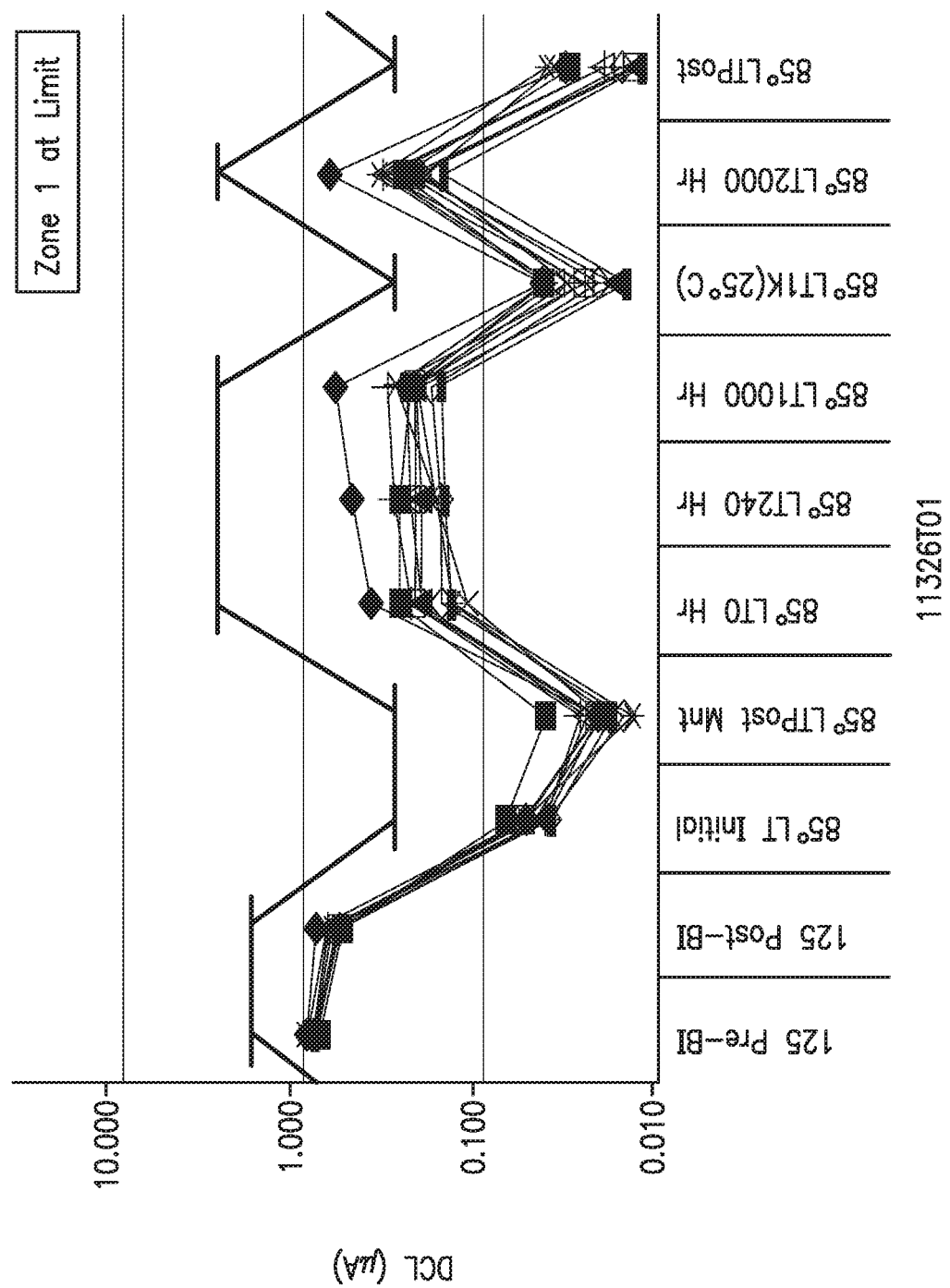
FIG. 14 is a graph tracking the leakage currents of the capacitors with the ten highest leakage currents post-burn in but still within the three standard deviation cutoff limit at the first leakage current measurement as the capacitors are subjected to 2000 hour life testing at 85° C. at rated voltage.

Referring to FIG. 14, a graph is shown that tracks the leakage currents of the capacitors with the ten highest first leakage current measurements that were still within the three standard deviation cutoff limit (i.e. "Zone 1") at the first iteration leakage current measurement of FIG. 5. Although these 10 capacitors have first leakage current measurements close to the three standard deviation cutoff limit, the capacitors remained stable throughout life testing, indicating the relative effectiveness of the three standard deviation leakage current cutoff limit used in the iterative screening method of the pending claims.

Figure 15:
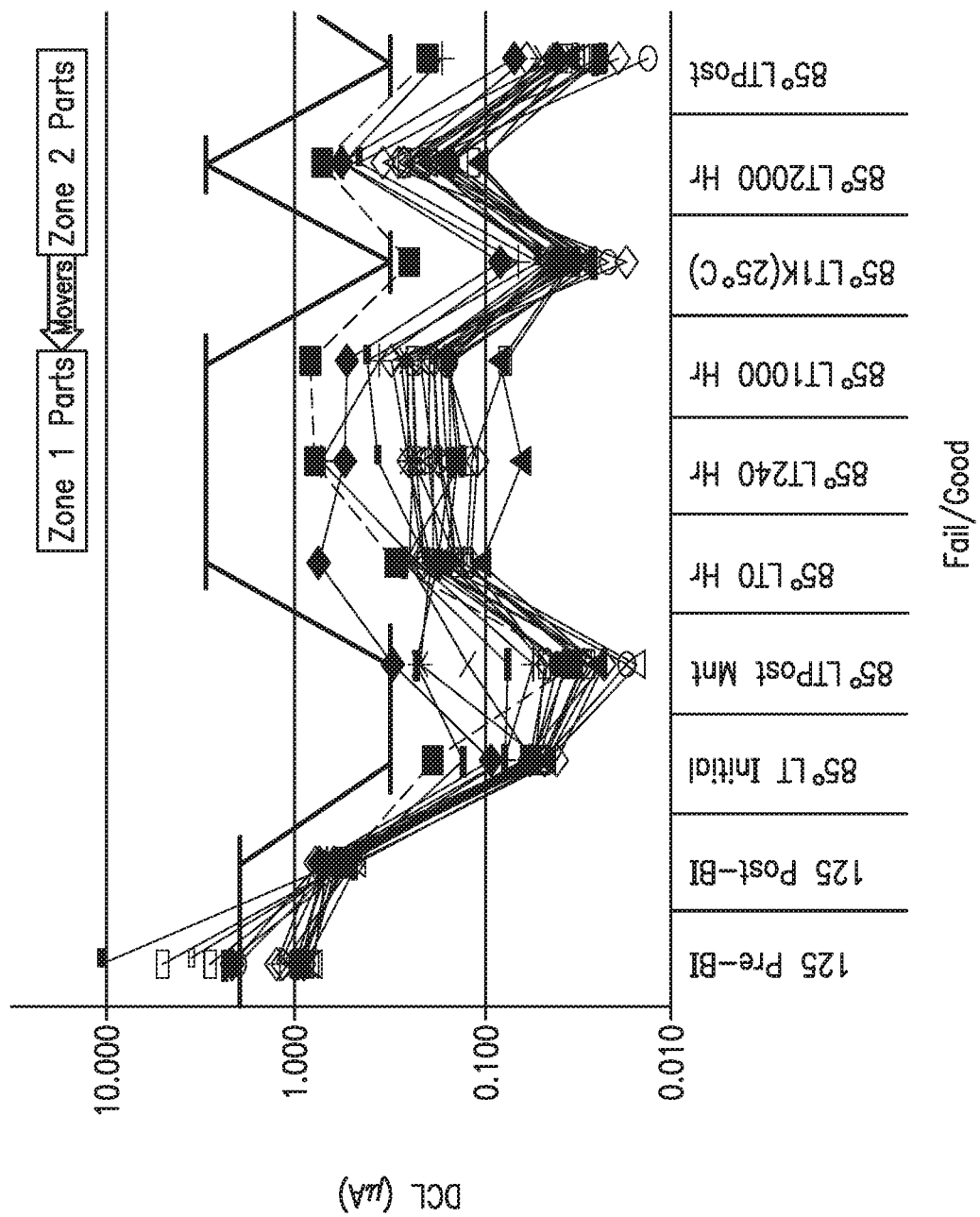
FIG. 15 is a graph showing the leakage current behavior of capacitors that failed the first leakage current pre-burn in screening and were initially categorized as "Zone 2" parts but exhibited self-healing and would have become "Zone 1" parts at later testing.

Turning to FIG. 15, a graph is shown that tracks the leakage current behavior of capacitors that failed the first leakage current pre-burn in screening by having leakage currents above the three-standard deviation cutoff limit and were thus initially categorized as "Zone 2" parts. However, during burn in, these "Zone 2" parts exhibited self-healing so that their second iteration leakage current was reduced to fall within the three-standard deviation second leakage current cutoff limit (after burn in). While these capacitors pass life testing by being within the three standard deviation limit after 2000 hours, the iterative screening method of the pending claims rejects these capacitors. Although the capacitors technically would pass the life testing, the instability during the life testing warrants the removal of such capacitors from their respective lots.

Figure 16:
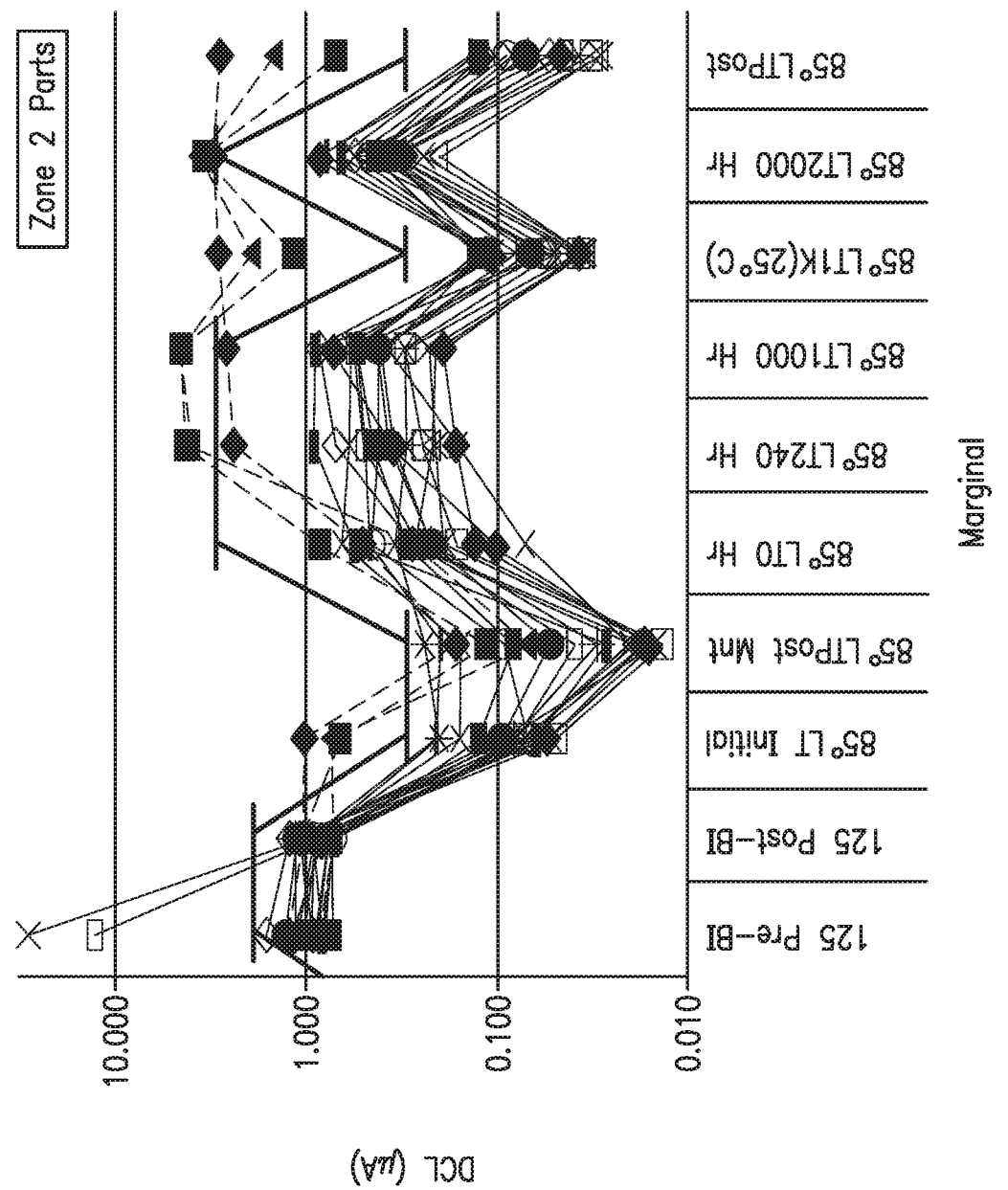
FIG. 16 is a graph showing the leakage current behavior of capacitors that failed the first leakage current screening but were within the 0.01*CV*12 limit.

Next, FIG. 16 is a graph showing the leakage current behavior of capacitors that exceeded the three-standard deviation first leakage current cutoff limit but were within the hard cut leakage current limit, which was 0.001*C*$V_R$*12. Although the majority of the capacitors appear stable through the 85° C. life test, this population is likely to contain unstable capacitors, as demonstrated by the three failed units represented by the three dotted lines.

As seen from Examples 1-3, the iterative screening method of the present invention is highly reliable in that life testing of a sample size of 1000 screened capacitors at 125° C. at ⅔ rated voltage for 1000 hours and at 85° C. at full rated voltage for 2000 hours results in zero failures up to a qualification leakage current limit of 0.005*C*$V_R$, which is half of the current military standard requirement for life testing, which is 0.01*C*$V_R$.

EXAMPLE 4

Comparison of DCL Pre-Burn in and Post-Burn in

Figure 17:
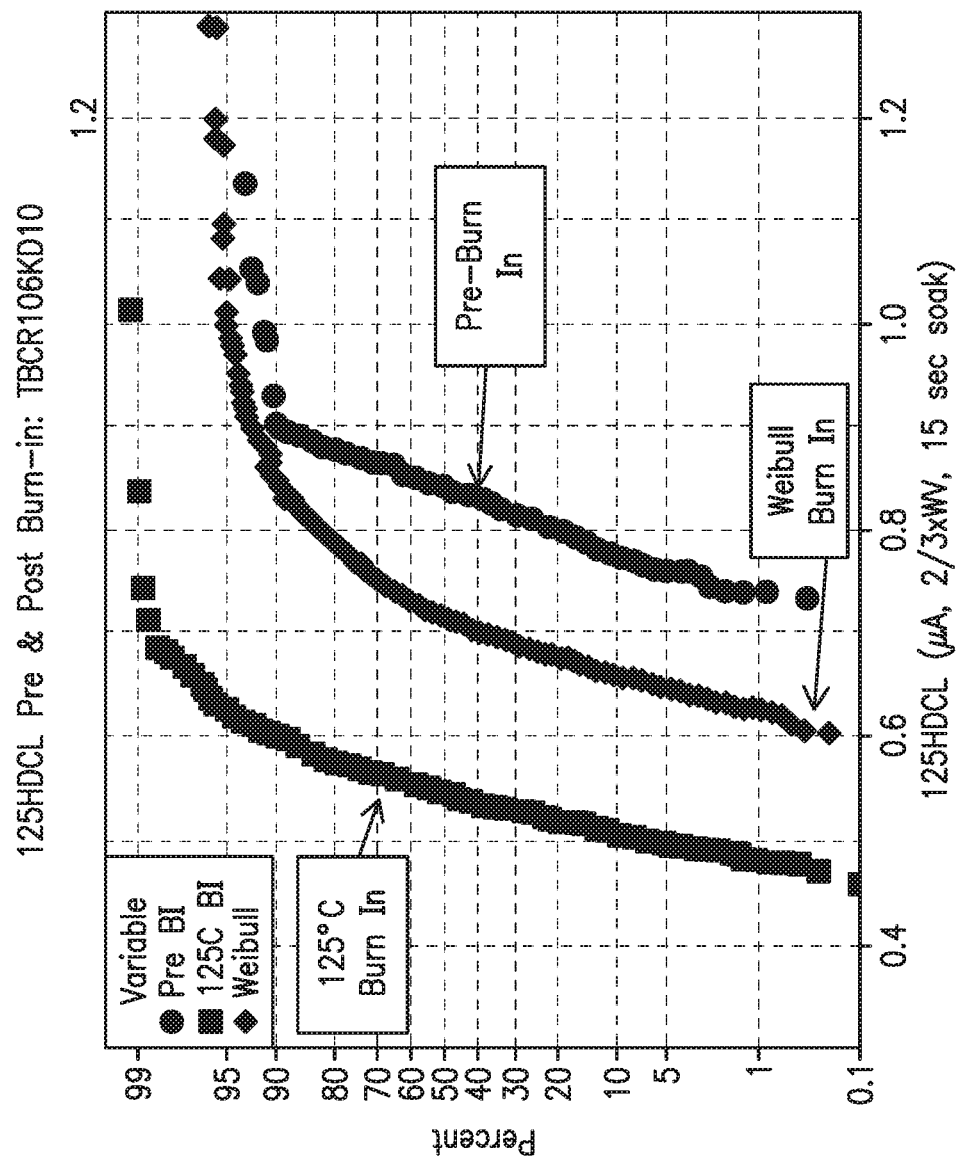
FIG. 17 is a graph comparing the pre-burn in leakage current of a group of capacitors to the post-burn in leakage current of capacitors after being subjected to the burn in process of the present invention and the Weibull burn in process.

Further, the leakage current of capacitors was determined at 125° C. and ⅔ working voltage after a 15 second soak before burn using the method of the present invention and the comparative Weibull method. Under the method of the present invention, burn in was performed at 125° C., while the Weibull method burn in was performed at 85° C. As shown in FIG. 17, the pre-burn in leakage current was generally higher than both post-burn in leakage currents and ranged from about 0.7 µA to about 1.2 µA. Meanwhile, the Weibull method post-burn in leakage current ranged from about 0.6 µA to about 1.3 µA, and the post-burn in leakage current of the method of the present application ranged from about 0.4 µA to about 1.0 µA. While FIG. 17 demonstrates the parametric shift in DC leakage current resulting from the burn in process of the present application, where the overall DC leakage current is significantly lower, FIG. 17 also shows that the DC leakage current of potentially damaged parts has been enhanced, such as the parts having a leakage current of from about 0.8 µA to about 1.0 µA, which can improve the effectiveness of the statistical screening method of the present invention.

EXAMPLE 5

85° C. Life Testing of Capacitors Passing or Failing the First DCL Screening

Next, the shift in leakage current after 85° C. life testing for 2 sets of capacitors from a lot—1 set passing the first leakage current (pre-burn in) screening and 1 set failing the first leakage current (pre-burn in) screening—was compared. The life testing as performed at 85° C. for 2000 hours, after which the shift in leakage current for each set of capacitors was determined. The results are shown in FIG. 18, where it is indicated that capacitors that would have been removed during the first leakage current (pre-burn in) screening in the method of the present application show a sizeable shift in leakage current after life testing, while the capacitors that passed the first leakage current (pre-burn in) screening and were accepted for later screening showed little shift in leakage current after life testing.

Figure 18:
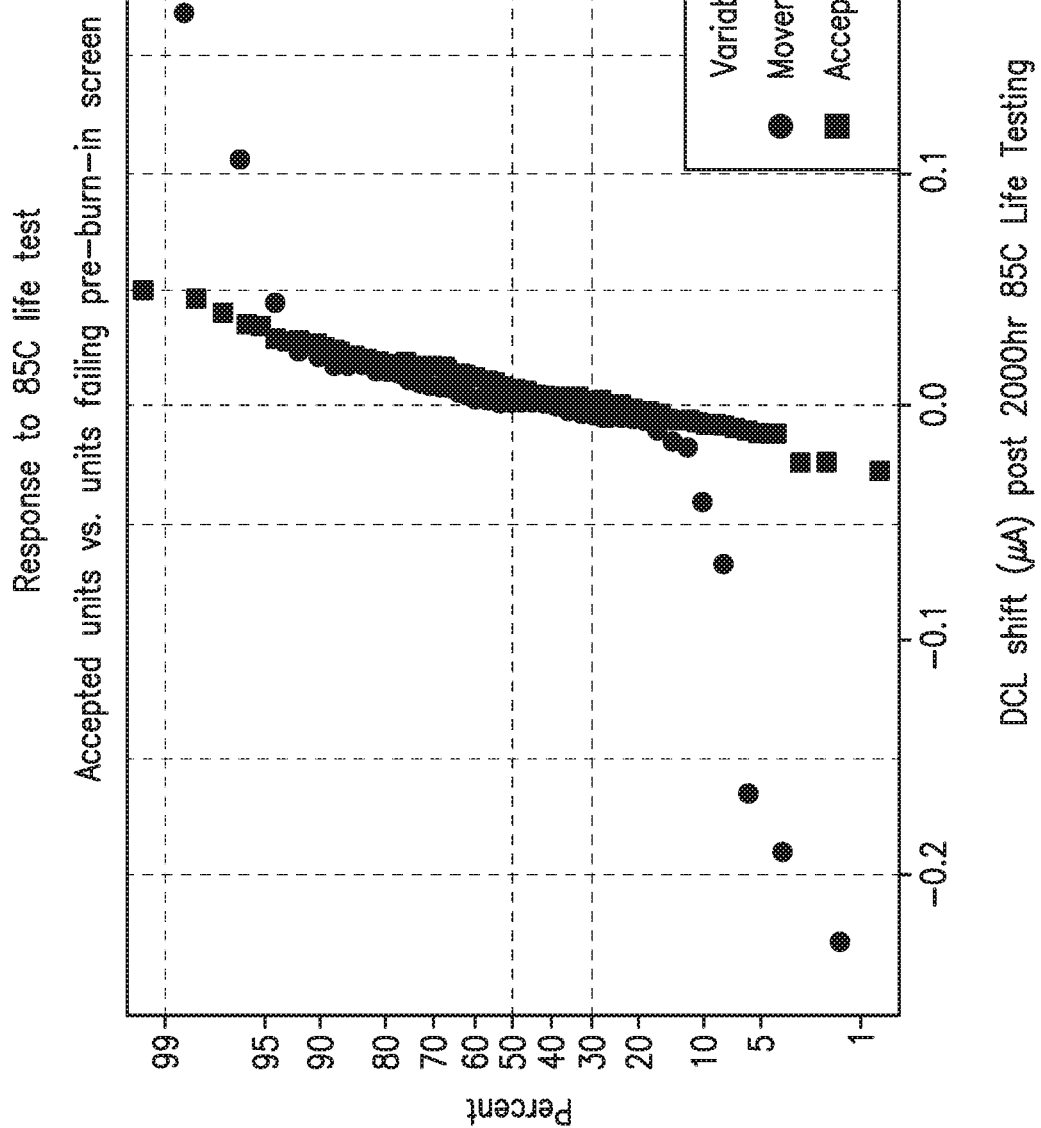
FIG. 18 is a graph comparing the leakage current shift of capacitors passing the pre-burn in screening process of the present invention with the leakage current shift of capacitors failing the pre-burn in leakage current screening process after subjecting the capacitors to 85° C. life testing.

FIG. 18 thus demonstrates that the method of the present application can remove inhomogeneous defects in the tested capacitors prior to the burn in process via a screening step based on leakage current where potentially unstable capacitors are removed. Without this screening step, these potentially unstable capacitors may move into the DCL distribution representing good capacitors after burn in during screening due to the healing process induced during burn in, yet after life testing, as shown in FIG. 18, these potentially unstable capacitors may show a sizeable leakage current shift, indicating these capacitors have defects uncharacteristic of the remainder of the capacitors in the lot. On the other hand, utilization of a statistical screening prior to 125° C. burn in as described in the present application reduces or eliminates the possibility that this small quantity of potentially parametrically unstable capacitors in the released lot.

EXAMPLE 6

Comparison of Leakage Current Determination at 25° C. and 125° C.

Figure 19:
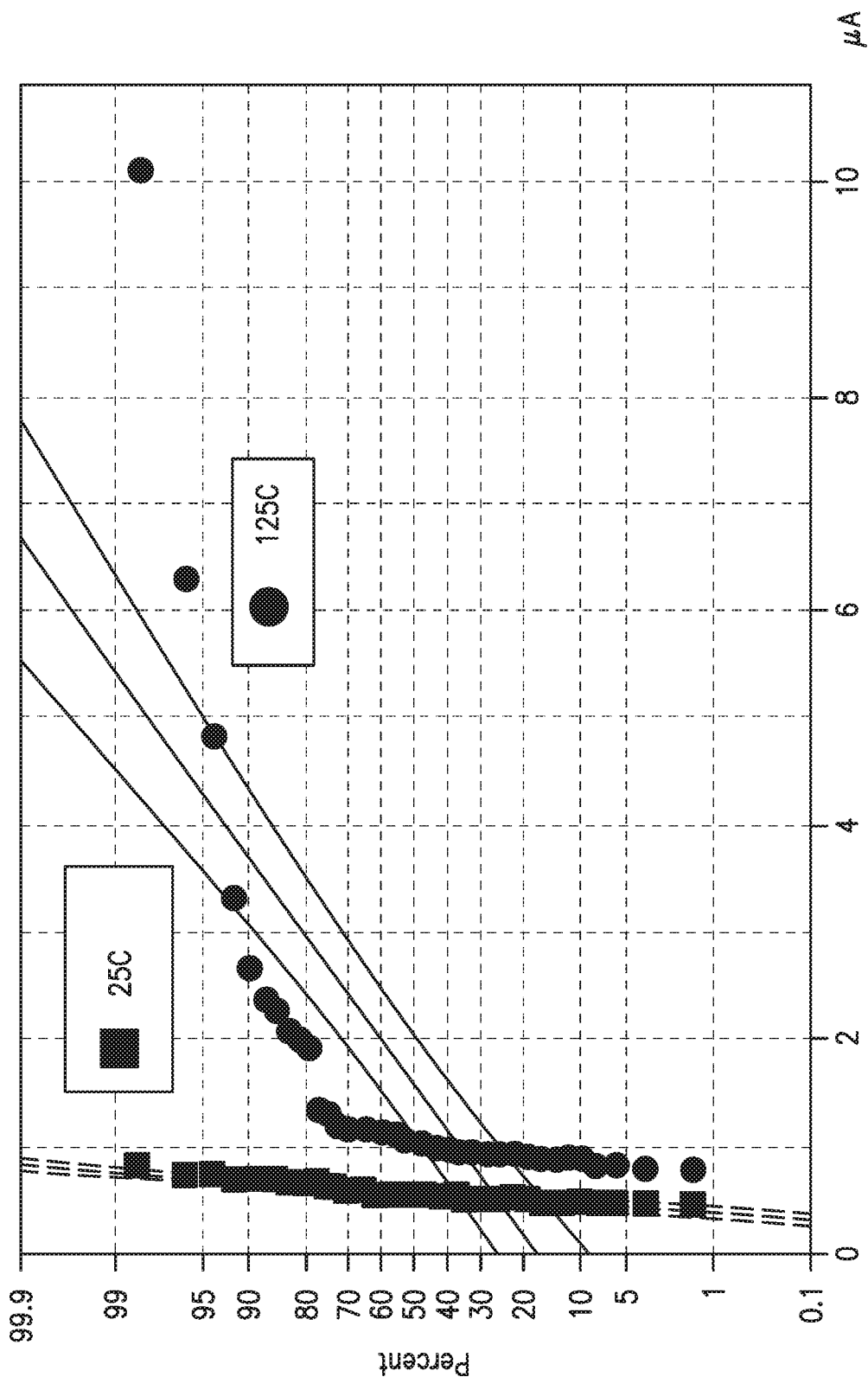
FIG. 19 is a graph comparing the leakage current for capacitors when tested at 25° C. and 125° C.

As discussed above, the screening method of the present application determines the leakage current of the capacitors being screened at elevated temperatures. FIG. 19 shows how determining the leakage current at elevated temperatures enhances the ability to detect individual capacitor variations in leakage current within a lot of capacitors that would normally be undetected during 25° C. (room temperature) testing. As shown, the capacitors tested at 25° C. do not show a parametric shift in leakage current, while a portion of the capacitors tested at 125° C. do show a parametric shift in leakage current, where the leakage current of these capacitors ranges from about 2 µA to about 10 µA. Had the temperature at which the leakage current was measured not been increased, these outlier capacitors would not have been detected and screened out of the lot, which means that potentially unstable capacitors would have passed the screening.

EXAMPLE 7

Demonstrated DCL Improvement with Elevated Temperature Burn in

Figure 20:
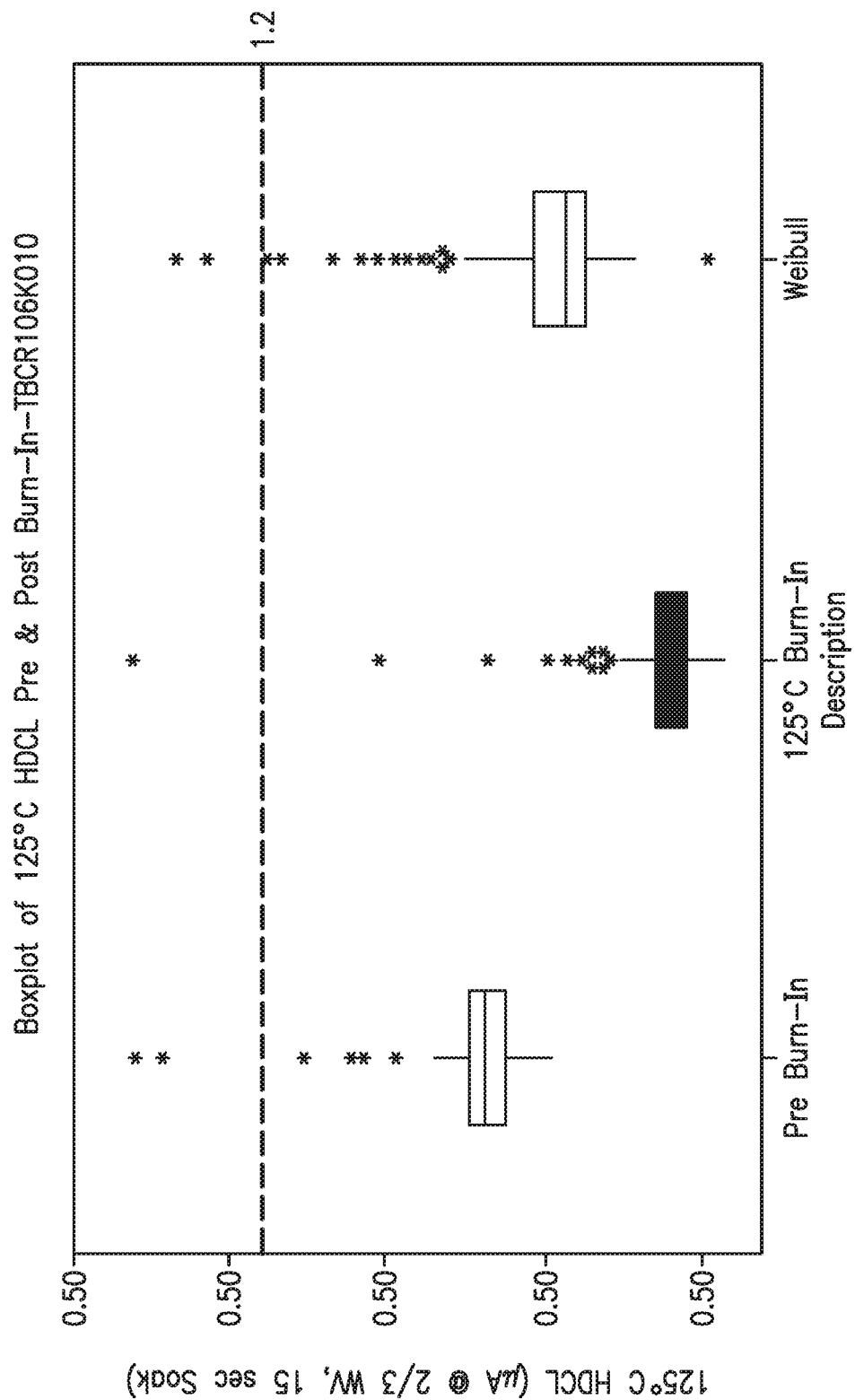
FIG. 20 is a graph comparing the pre-burn in leakage current of one lot of capacitors with the post-burn in leakage current of the capacitors after being subjected to the burn in process of the present invention and the Weibull burn in process.
Figure 21:
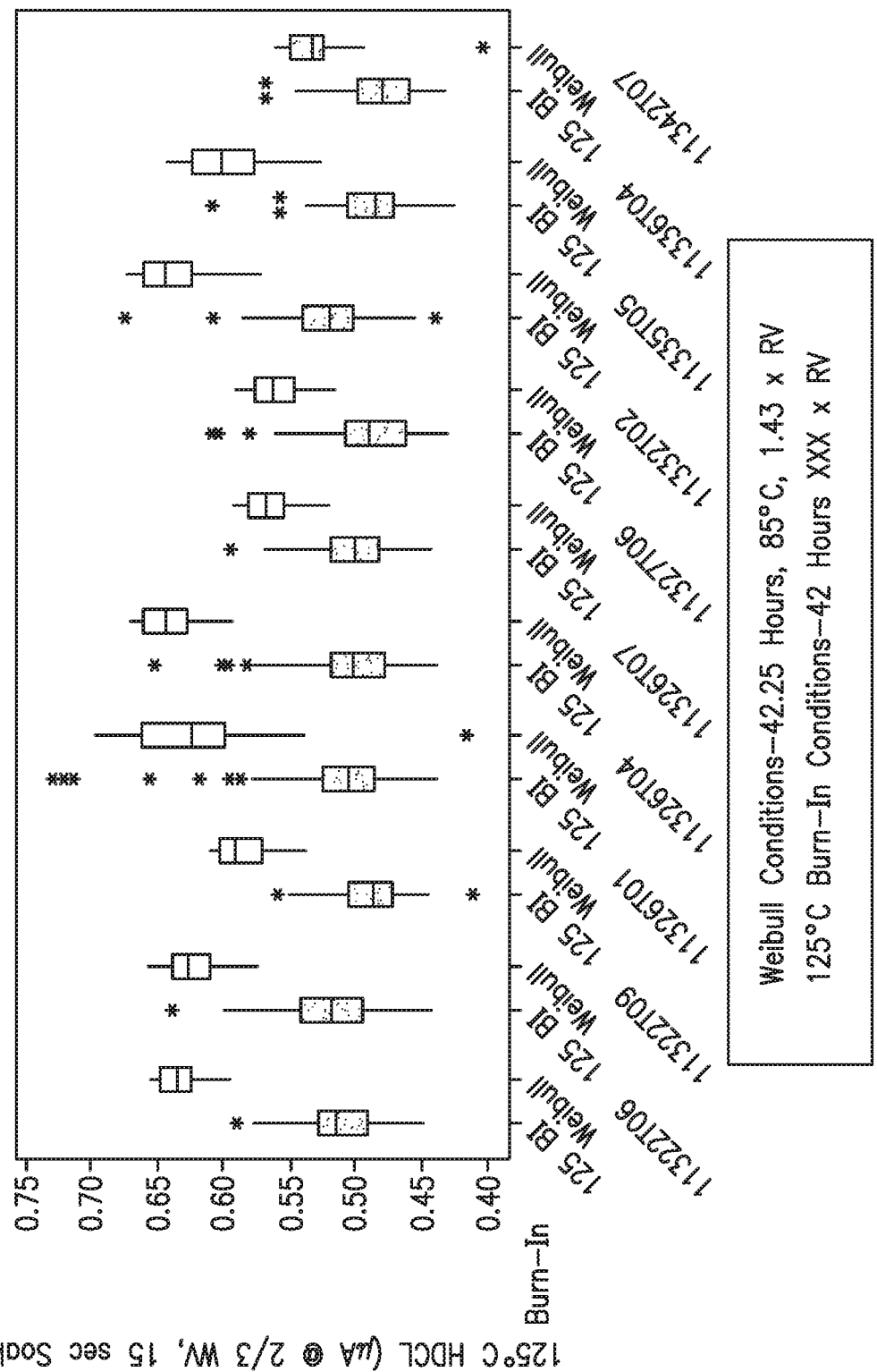
FIG. 21 is a graph comparing the pre-burn in leakage current of multiple lots of capacitors with the post-burn in leakage current of the capacitors after being subjected to the burn in process of the present invention and the Weibull burn in process.

FIGS. 20 and 21 show the improvement in overall leakage current when the burn in temperature is increased as compared to the conventional 85° C. burn in associated with the Weibull method. For instance, FIG. 20 shows the pre-burn in leakage current for a capacitor lot, compared with the leakage current after the 125° C. burn in process described in the present application and the 85° C. burn in process associated with the Weibull method. The leakage current for capacitors burned in at the elevated 125° C. temperature generally have a lower leakage current than the capacitors burned in using the Weibull method, yet at the same time, any outliers can be more easily exposed. Meanwhile, FIG. 21 shows that the reduced DCL following the 125° C. burn in process described in the present application is repeatable across multiple lots.

EXAMPLE 8

Life Testing at 125° C. and ⅔ Working Voltage for 1000 Hours

Figure 22:
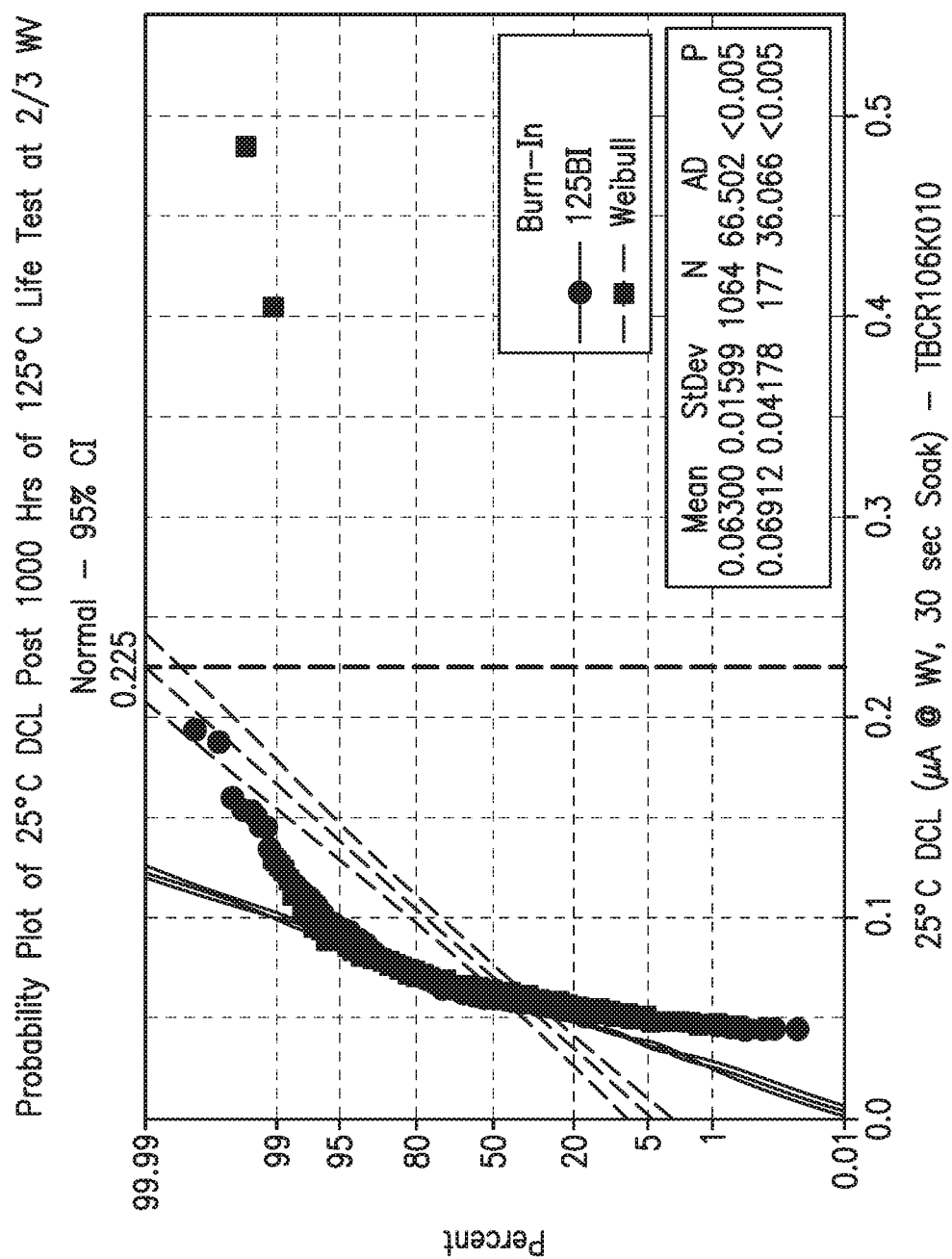
FIG. 22 is a graph comparing the life testing of capacitors subjected to the pre-burn in screening and subsequent burn in process of the present invention with the Weibull burn in process.

Next, FIG. 22 compares the leakage current of capacitors undergoing the initial leakage current screening and the 125° C. burn in process as described in the present application with the leakage current of capacitors undergoing an 85° C. burn in process as per the Weibull method after 1000 hours of life testing at 125° C. and ⅔ of the working voltage where the specified hard cut leakage current limit was set at 0.225 µA. The leakage current was determined at 25° C. at the working voltage of the capacitors after a 30 second soak time. 10 capacitors from 10 lots screened via the method described in the present application were tested, along with 170 capacitors burned in via the traditional Weibull method at 85° C.

As shown, two capacitors burned in using the Weibull method failed after life testing as their leakage currents were above the predetermined limit of 0.225 µA. In particular, the two failed parts had leakage currents post-burn in of about 0.4 µA and 0.5 µA. On the other hand, none of the capacitors screened and burned in using the method of the present application failed in that none of the capacitors demonstrated a leakage current above the 0.225 µA limit.

EXAMPLE 9

Effect of Screening Method on Leakage Current

Figure 23:
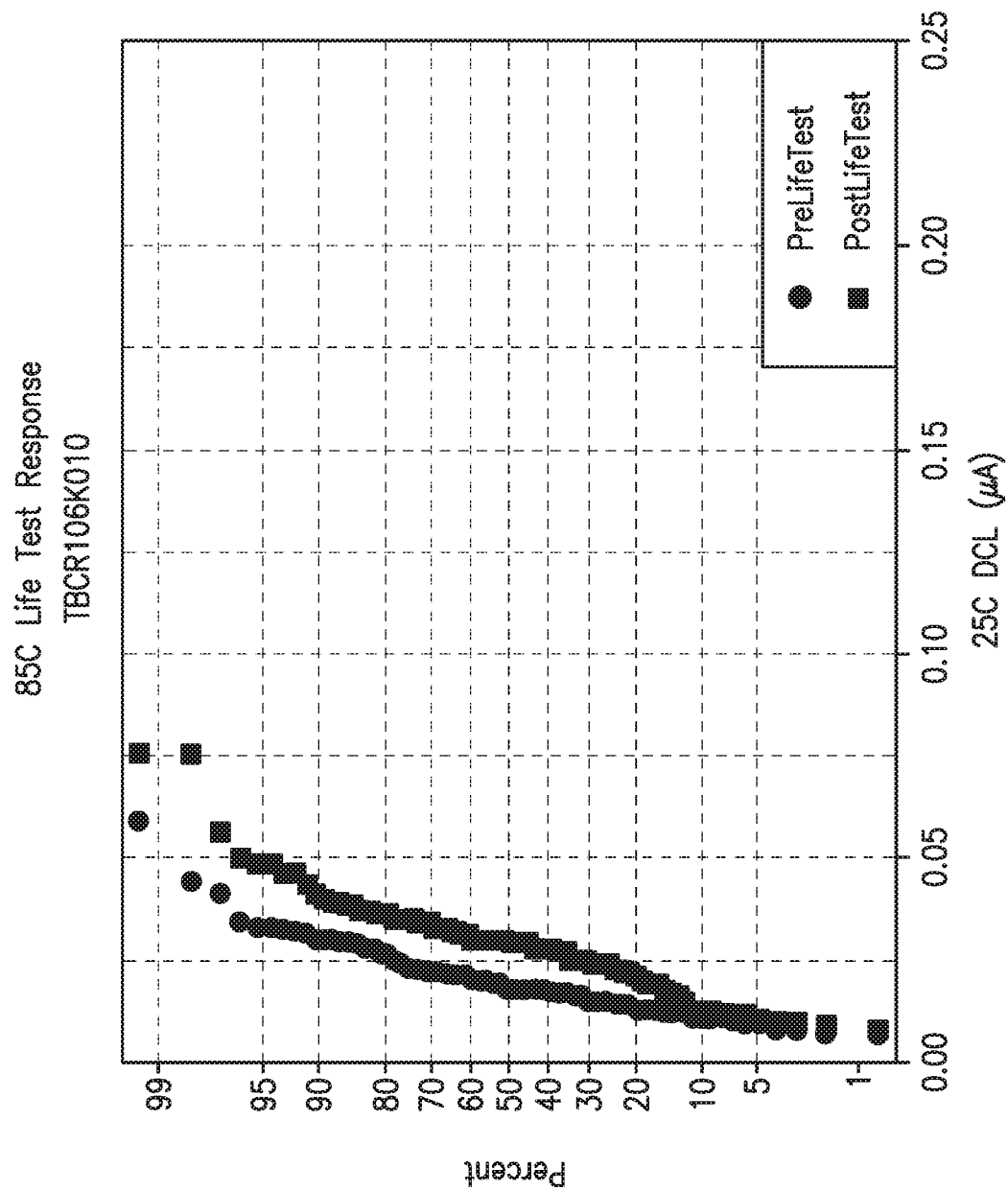
FIG. 23 is a graph showing the shift in leakage current after 85° C. life testing of capacitors subjected to the screening and burn in process of the present application.

Further, the leakage currents of 10 capacitors sampled from 10 lots of capacitors that were subjected to the screening method of the present application after life testing at 85° C. and rated voltage for 2000 hours were compared to their pre-life testing leakage currents. As shown in FIG. 23, after 2000 hours of life testing, the shift in leakage current pre- and post-life testing was negligible.

EXAMPLE 10

Life Testing of Zone 1, Zone 1 at Limit, and Zone 2 Parts at 85° C. for 2000 Hours In another example, the leakage current for capacitors in 10 lots was determined post 125° C. burn in. The capacitors were then grouped into "Zone 1" capacitors, "Zone 1 at Limit" capacitors, and "Zone 2" capacitors as discussed above based on FIG. 5. "Zone 1" included the capacitors having a leakage current that was within three standard deviations of the mean leakage current, which, in this case, is measured at a temperature of 125° C. and at a voltage that is ⅔ the rated voltage. "Zone 1 at Limit" included capacitors having a leakage current within three standard deviations of the mean leakage current but that also had leakage currents close to the three standard deviation limit (i.e., the capacitors having the 10 highest leakage currents post-burn in that were within the three standard deviation limit). "Zone 2" included capacitors having a leakage current above three standard deviations of the mean leakage current but that was also less than the hard cut limit of 0.225 µA. After grouping the capacitors into the appropriate zones, the capacitors were then subjected to 2000 hours of life testing at 85° C. Then, the leakage current for each of the capacitors in each zone was measured at 25° C.

EXAMPLE 11

Failure Rate Calculation for 60% Confidence Level

In Example 11, Table 1 below shows the inputs and outputs for a failure rate calculation using the formulas discussed above. In Example 11, a 60% confidence level was selected, and 30 capacitors having a rated voltage of 10 were tested for 6 hours at a temperature of 125° C. at ⅔ the rated voltage, which was 6.6 volts. The predicted failure rate was then calculated assuming that the capacitors would be used by the customer at 25° C. and at a voltage of 5 volts. As shown in Table 1, testing the capacitors at 125° C. for 6 hours at 6.6 volts was the equivalent of about 2,000,000 hours at 25° C. and 5 volts, and resulted in a predicted failure rate of about 0.0029% failures per 1000 hours.

TABLE 1

| EXAMPLE 11: FAILURE RATE CALCULATION FOR ITERATIVE SCREENING METHOD | | | |
| --- | --- | --- | --- |
| INPUTS | (10 V Part) | OUTPUTS | |
| Rated Voltage (V) | 10 | Component Hours$^2$ (Equivalent at Application Temp) | 1,978,593 |
| Number of Capacitors Tested | 30 | Component Years (Equivalent at Application Temp) | 225.71 |
| Hours Tested | 6 | Test Acceleration Factor$^3$ (Temperature) | 38,234.21 |
| Test Temperature (C.) | 125 | Test Acceleration Factor$^4$ (Voltage) | 0.287496 |
| Test Voltage (V) | 6.6 | Application Acceleration Factor$^5$ (Voltage) | 0.1250 |
| Number of Failures | 0 | | |
| Confidence Level (%) | 60 | Failure Rate$^6$ (Percent Failures per 1000 Hours) | 0.002894 |
| Application Temperature (C.) | 25 | MTBF (Mean Time Between Failures) (Hours) | 34,549,607 |
| Application Voltage (V) | 5 | | |
| Activation Energy$^1$ of Tantalum Cap (eV) | 1.08 | | |

Figure 24:
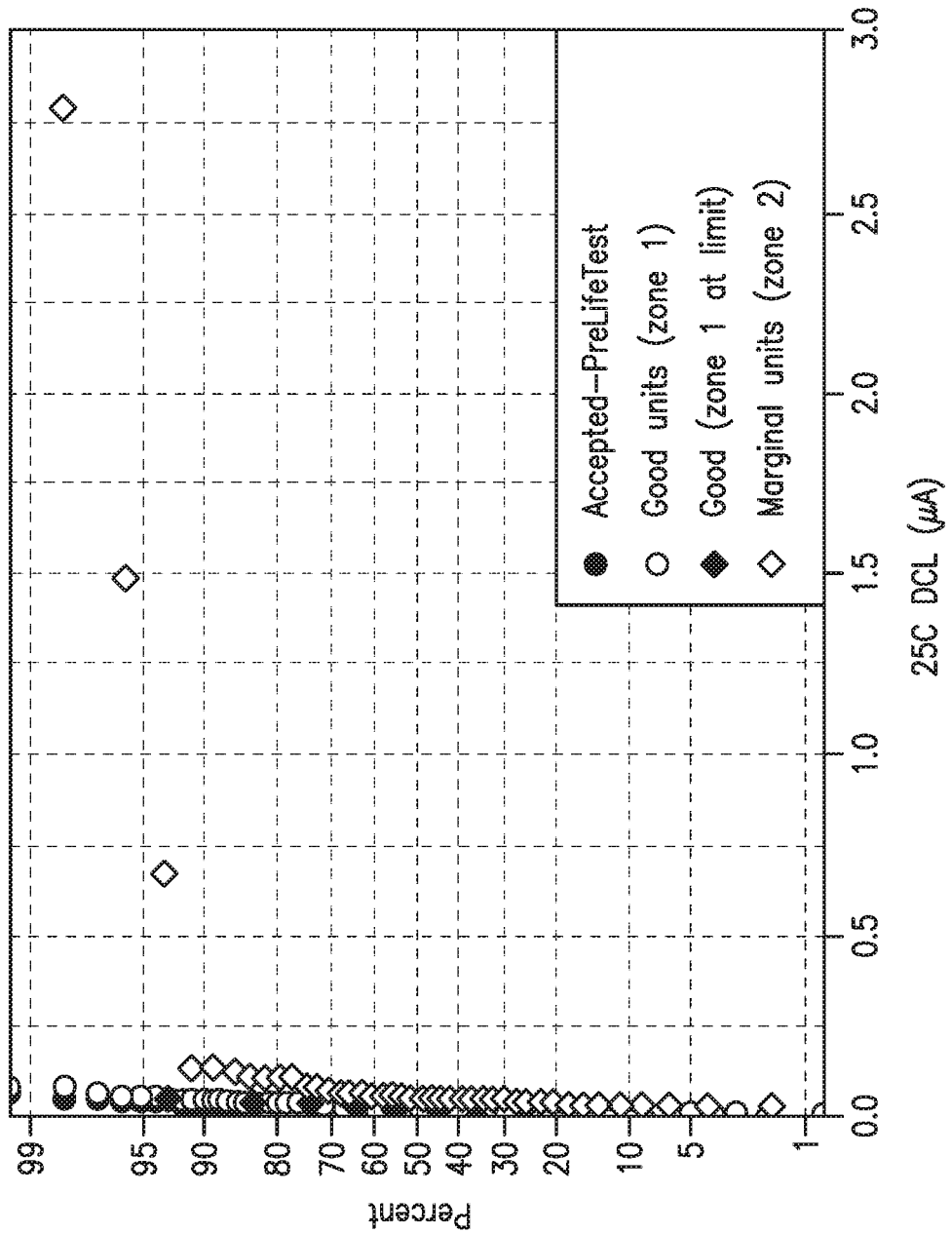
FIG. 24 is a graph comparing the pre-life testing leakage currents of capacitors in a lot with the post-life testing leakage current of the capacitors, where the capacitors are grouped into zone 1 units, zone 1 at limit units, and zone 2 units as shown in FIG. 5.

Assumptions and factors in the formulas:
[1]The Activation Energy is adjustable
[2]The Equivalent Component Hours is based upon the MIL-HDBK-217 model for Solid Tantalum Capacitors, and the Total Component Hours Tested at Test Temperature is multiplied by the Test Temperature Acceleration Factor and the Test Voltage Acceleration Factor to get the Equivalent Component Hours used in calculating the failure rate
[3]Test Temperature Acceleration Factor is based upon the Arrhenius model; the temperatures are in Kelvin, and the Boltzmann Constant = 8.63E−5 eV/K
[4]The Test Voltage Acceleration Factor is the Test Voltage divided by the Rated Voltage, cubed
[5]The Application Voltage Acceleration Factor is Application Voltage divided by the Rated Voltage, cubed
[6]Failure Rate predictions are based on Chi-Squared distribution; the Degrees of Freedom in the use of the Chi-Squared Distribution is the number of failures plus 1 multiplied by 2; and the calculated failure rate is multiplied by the Application Voltage Acceleration Factor to get the Final Failure Rate As shown in FIG. 24, three capacitors grouped in "Zone 2" that were within the hard cut leakage current limit of 0.225 µA before life testing failed after life testing and had leakage currents of about 0.75 µA, 1.5 µA, and 2.75 µA. Meanwhile, all of the "Zone 1" parts and "Zone 1 at Limit" parts had leakage currents below the 0.225 µA limit after life testing. This indicates that the traditional hard cut limits do not effectively remove parts that have reliability issues later on, such as those capacitors that had leakage currents that were initially within the hard cut limit but had leakage currents above the hard cut limit after life testing.

Figure 25:
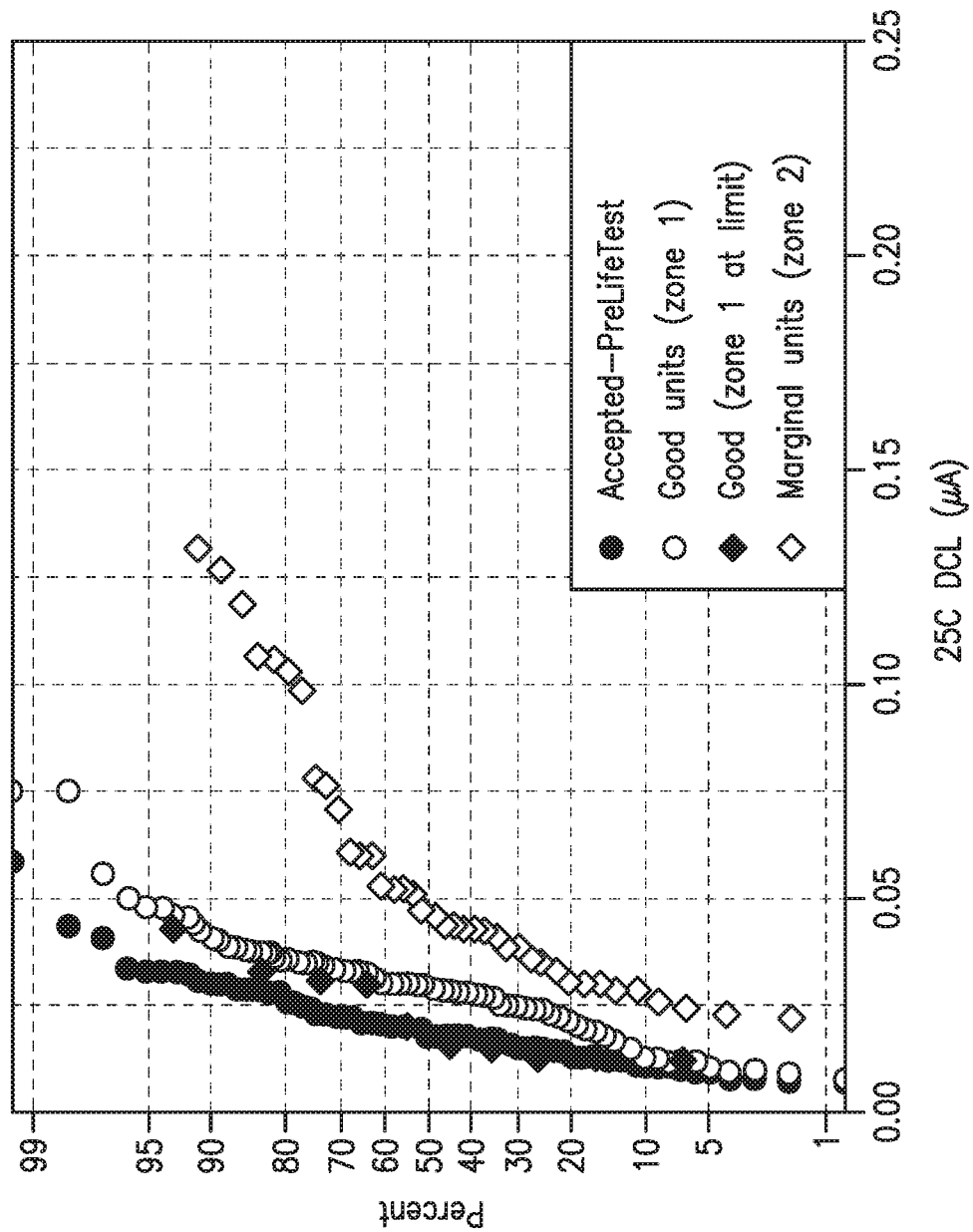
FIG. 25 is the graph of FIG. 24 that is scaled to show the leakage current up to about 0.25 microamps (μA)

FIG. 25 is a zoomed in view of FIG. 24 and shows that the leakage current of the "Zone 2" parts is increased as compared to the "Zone 1" and "Zone 1 at Limit" parts, indicating possible issues with reliability of the "Zone 2" parts.

EXAMPLE 12

Failure Rate Calculation for 90% Confidence Level

In Example 12, Table 2 below shows the inputs and outputs for a failure rate calculation using the formulas discussed above. In Example 12, a 90% confidence level was selected, and 30 capacitors having a rated voltage of 10 were tested for 6 hours at a temperature of 125° C. at ⅔ the rated voltage, which was 6.6 volts. The predicted failure rate was then calculated assuming that the capacitors would be used by the customer at 25° C. and at a voltage of 5 volts. As shown in Table 1, testing the capacitors at 125° C. for 6 hours at 6.6 volts was the equivalent of about 2,000,000 hours at 25° C. and 5 volts, and resulted in a predicted failure rate about 0.0072% failures per 1000 hours.

TABLE 2

| EXAMPLE 12: FAILURE RATE CALCULATION FOR ITERATIVE SCREENING METHOD | | | |
| --- | --- | --- | --- |
| INPUTS | (10 V Part) | OUTPUTS | |
| Rated Voltage (V) | 10 | Component Hours$^2$ (Equivalent at Application Temp) | 1,978,593 |
| Number of Capacitors Tested | 30 | Component Years (Equivalent at Application Temp) | 225.71 |
| Hours Tested | 6 | Test Acceleration Factor$^3$ (Temperature) | 38,234.21 |
| Test Temperature (C.) | 125 | Test Acceleration Factor$^4$ (Voltage) | 0.287496 |
| Test Voltage (V) | 6.6 | Application Acceleration Factor$^5$ (Voltage) | 0.1250 |
| Number of Failures | 0 | | |
| Confidence Level (%) | 90 | Failure Rate$^6$ (Percent Failures per 1000 Hours) | 0.007273 |

TABLE 2-continued

EXAMPLE 12: FAILURE RATE CALCULATION FOR ITERATIVE SCREENING METHOD

| INPUTS | (10 V Part) | OUTPUTS | |
|---|---|---|---|
| Application Temperature (C.) | 25 | MTBF (Mean Time Between Failures) (Hours) | 13,748,671 |
| Application Voltage (V) | 5 | | |
| Activation Energy[1] of Tantalum Cap (eV) | 1.08 | | |

Assumptions and factors in the formulas:
[1] The Activation Energy is adjustable
[2] The Equivalent Component Hours is based upon the MIL-HDBK-217 model for Solid Tantalum Capacitors, and the Total Component Hours Tested at Test Temperature is multiplied by the Test Temperature Acceleration Factor and the Test Voltage Acceleration Factor to get the Equivalent Component Hours used in calculating the failure rate
[3] Test Temperature Acceleration Factor is based upon the Arrhenius model; the temperatures are in Kelvin, and the Boltzmann Constant = 8.63E−5 eV/K
[4] The Test Voltage Acceleration Factor is the Test Voltage divided by the Rated Voltage, cubed
[5] The Application Voltage Acceleration Factor is Application Voltage divided by the Rated Voltage, cubed
[6] Failure Rate predictions are based on Chi-Squared distribution; the Degrees of Freedom in the use of the Chi-Squared Distribution is the number of failures plus 1 multiplied by 2; and the calculated failure rate is multiplied by the Application Voltage Acceleration Factor to get the Final Failure Rate These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method of iteratively screening a lot of electrolytic capacitors having a predetermined rated voltage, the method comprising:
    measuring a first leakage current of a first set of capacitors in the lot and calculating a first mean leakage current therefrom;
    removing capacitors from the first set that have a measured first leakage current equal to or above a first predetermined value, thereby forming a second set of capacitors, the first predetermined value being equal to one or more standard deviations above the first mean leakage current;
    subjecting the second set of capacitors to a burn in treatment, wherein the burn in treatment comprises applying a predetermined test voltage to the capacitors that is from about 0.8 to about 1.2 times the rated voltage;
    after the burn in treatment, measuring a second leakage current of the second set of capacitors and calculating a second mean leakage current therefrom;
    soldering the second set of capacitors via a reflow process, wherein the soldering occurs between the burn in heat treatment and the second leakage current measurement; and
    removing capacitors from the second set that have a measured second leakage current equal to or above a second predetermined value, thereby forming a third set of capacitors, the second predetermined value being equal to one or more standard deviations above the second mean leakage current.

2. The method of claim 1, wherein the first leakage current is determined at a temperature ranging from about 20° C. to about 150° C.

3. The method of claim 1, wherein the first predetermined value is equal to three or more standard deviations above the first mean leakage current.

4. The method of claim 1, wherein the burn in heat treatment occurs for a time period ranging from about 25 hours to about 75 hours.

5. The method of claim 1, wherein the predetermined test voltage ranges from about 0.9 to about 1.1 times the predetermined rated voltage.

6. The method of claim 1, wherein the burn in heat treatment is conducted at a temperature ranging from about 100° C. to about 150° C.

7. The method of claim 1, wherein the second leakage current is determined at a temperature ranging from about 20° C. to about 150° C.

8. The method of claim 1, wherein the second predetermined value is equal to three or more standard deviations above the second mean leakage current.

9. The method of claim 1, further comprising soldering the first set and/or third set of capacitors via the reflow process.

10. The method of claim 9, wherein the third set of capacitors are soldered via the reflow process.

11. The method of claim 1, wherein the reflow process occurs in a convection oven at a peak temperature profile ranging from about 200° C. to about 280° C.

12. The method of claim 1, further comprising the steps of:
    measuring a third leakage current of the third set of capacitors and calculating a third mean leakage current therefrom;
    removing capacitors from the third set that have a measured third leakage current equal to or above a third predetermined value, the third predetermined value being equal to one or more standard deviations above the third mean leakage current.

13. The method of claim 12, wherein the third leakage current is determined at a temperature ranging from about 15° C. to about 35° C.

14. The method of claim 12, wherein the third predetermined value is equal to three or more standard deviations above the third mean leakage current.

15. The method of claim 1, wherein the capacitors are solid electrolytic capacitors.

16. The method of claim 15, wherein the solid electrolytic capacitors are hermetically sealed.

17. The method of claim 1, wherein the capacitors are wet electrolytic capacitors.

18. The method of claim 1, wherein the capacitors comprise an anode that contains tantalum or niobium oxide.

19. The method of claim 1, wherein the first predetermined value is less than the product of 0.01 times the capacitance times the rated voltage of the capacitors.

20. The method of claim 1, wherein the first set includes all of the capacitors in the lot.

21. The method of claim 1, wherein multiple lots of capacitors are iteratively screened.

22. The method of claim 21, further comprising using a mean leakage current for each of the multiple lots of capacitors to calculate a grand mean leakage current therefrom, wherein the mean leakage current for each of the multiple lots of capacitors is the mean leakage current for the second set, the third set, or any other subsequent set of iteratively screened capacitors in each of the multiple lots; and removing any lots having a mean leakage current equal to or above a fourth predetermined value, the fourth predetermined value being equal to one or more standard deviations above the grand mean leakage current.

23. The method of claim 22, wherein the fourth predetermined value is equal to three or more standard deviations above the grand mean leakage current.

24. The method of claim 1, further comprising determining a predicted failure rate for the lot of capacitors, wherein a calculation to determine the predicted failure rate excludes capacitors removed from the first set.

25. The method of claim 24, where the predicted failure rate calculation utilizes a voltage acceleration factor based on a voltage applied to the lot of capacitors during a life testing process and a temperature acceleration factor based on a temperature at which the life testing process occurs.

26. The method of claim 24, where the predicted failure rate ranges from about 0.00001% failures per 1000 hours to about 0.008% failures per 1000 hours as determined at a confidence level of about 99.9%.

27. A method for calculating a predicted failure rate for a lot of electrolytic capacitors, the method comprising:
subjecting the capacitors to a burn in treatment at a first temperature and a first voltage for a first time period;
subjecting the capacitors to a life test at a second temperature and a second voltage for a second time period after the capacitors have been subjected to the burn in treatment; and
determining a number of capacitors failing after the life test based on a number of capacitors having a leakage current above a predetermined level, wherein the calculation to determine the predicted failure rate excludes capacitors failing prior to the burn in treatment, wherein the predicted failure rate calculation further comprises utilizing a voltage acceleration factor based on a voltage applied to the lot of capacitors during the life test and a temperature acceleration factor based on the temperature at which the life test occurs.

28. The method of claim 27, wherein the predicted failure rate ranges from about 0.00001% failures per 1000 hours to about 0.008% failures per 1000 hours as determined at a confidence level of about 90%.

* * * * *